US006660449B2

(12) United States Patent
Zheng et al.

(10) Patent No.: US 6,660,449 B2
(45) Date of Patent: Dec. 9, 2003

(54) HEAT-SENSITIVE COMPOSITIONS AND IMAGING MEMBER CONTAINING CARBON BLACK AND METHODS OF IMAGING AND PRINTING

(75) Inventors: Shiying Zheng, Webster, NY (US); Xiaoru Wang, Rochester, NY (US); Jeffrey W. Leon, Rochester, NY (US); Edward Schofield, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 204 days.

(21) Appl. No.: 10/083,258

(22) Filed: Oct. 19, 2001

(65) Prior Publication Data

US 2003/0113653 A1 Jun. 19, 2003

(51) Int. Cl.[7] .......... G03F 7/038

(52) U.S. Cl. .......... 430/270.1; 430/138; 430/281.1; 430/284.1; 430/302; 430/303; 430/348; 430/494; 430/944; 430/945; 430/964; 101/453; 101/463.1; 101/467

(58) Field of Search .......... 430/138, 270.1, 430/281.1, 284.1, 286.1, 287.1, 288.1, 302, 303, 348, 401, 494, 944, 945, 964; 101/453, 463.1, 465, 466, 467

(56) References Cited

U.S. PATENT DOCUMENTS 4,547,456 A 10/1985 Kojima et al. .......... 430/330
5,512,418 A 4/1996 Ma .......... 430/271.1
5,569,573 A 10/1996 Takahashi et al. .......... 430/138
5,948,596 A * 9/1999 Zhong et al. .......... 430/278.1
5,985,514 A * 11/1999 Zheng et al. .......... 430/270.1
6,190,830 B1 2/2001 Leon et al. .......... 430/270.1
6,190,831 B1 2/2001 Leon et al. .......... 430/270.1
6,245,479 B1 6/2001 Etzel .......... 430/200
6,399,268 B1 * 6/2002 Fleming et al. .......... 430/270.1

FOREIGN PATENT DOCUMENTS

EP 0 652 483 A1 5/1995
EP 0 931 647 A1 7/1999
EP 1 075 942 A2 2/2001
WO WO 88/04237 6/1988
WO WO 92/09934 6/1992

OTHER PUBLICATIONS

USSN 09/293,389 (D–79272) "Processless Direct Write Imaging Member Containing Polymer Grafted Carbon and Methods of Imaging and Printing" by J.C. Fleming et al.

* cited by examiner

*Primary Examiner*—Janet Baxter
*Assistant Examiner*—Barbara Gilliam
(74) *Attorney, Agent, or Firm*—J. Lanny Tucker

(57) ABSTRACT

An imaging member, such as a negative-working printing plate or on-press cylinder, comprises latex polymer-carbon black composite particles. Such imaging members can be prepared with a hydrophilic imaging layer comprised of a heat-sensitive hydrophilic polymer having ionic moieties and the latex polymer-carbon black composite particles as a photothermal conversion material. The latex polymer-carbon black composite particles can be formulated in water or water-miscible solvents without agglomeration with other components such as charged polymers.

45 Claims, No Drawings

HEAT-SENSITIVE COMPOSITIONS AND IMAGING MEMBER CONTAINING CARBON BLACK AND METHODS OF IMAGING AND PRINTING

FIELD OF THE INVENTION

This invention relates in general to thermal imaging compositions, and to heat-sensitive imaging members (and particularly to lithographic printing plates) prepared therefrom. The invention also relates to a method of imaging such imaging members, and to a method of printing using them.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared surface is moistened with water and ink is then applied, the background or non-imaged areas retain the water and repel the ink while the imaged areas accept the ink and repel the water. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure, and perhaps post-exposure heating, either imaged or non-imaged areas are removed using wet processing chemistries.

Thermally sensitive printing plates are becoming more common. Examples of such plates are described in U.S. Pat. No. 5,372,915 (Haley et al.). They include an imaging layer comprising a mixture of dissolvable polymers and an infrared radiation absorbing compound. While these plates can be imaged using lasers and digital information, they require wet processing using alkaline developer solutions.

It has been recognized that a lithographic printing plate could be created by ablating an IR absorbing layer. For example, Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). Such plates were exposed to focused near IR radiation with a $Nd^{++}YAG$ laser. The absorbing layer converted the infrared energy to heat thus partially loosening, vaporizing or ablating the absorber layer and the overlying silicone rubber.

While the noted printing plates used for digital, processless printing have a number of advantages over the more conventional photosensitive printing plates, there are a number of disadvantages with their use. The process of ablation creates debris and vaporized materials that must be collected. The laser power required for ablation can be considerably high, and the components of such printing plates may be expensive, difficult to coat, or unacceptable for resulting printing quality. Such plates generally require at least two coated layers on a support.

Thermally switchable polymers have been described for use as imaging materials in printing plates. By "switchable" is meant that the polymer is rendered from hydrophobic to relatively more hydrophilic or, conversely from hydrophilic to relatively more hydrophobic, upon exposure to heat.

U.S. Pat. No. 4,034,183 (Uhlig) describes the use of high power lasers to convert hydrophilic surface layers to hydrophobic surfaces. A similar process is described for converting polyamic acids into polyimides in U.S. Pat. No. 4,081,572 (Pacansky). The use of high-powered lasers is undesirable in the industry because of their high electrical power requirements and because of their need for cooling and frequent maintenance.

U.S. Pat. No. 4,634,659 (Esumi et al.) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes), and the plate's use is in a positive-working mode only.

U.S. Pat. No. 4,405,705 (Etoh et al.) and U.S. Pat. No. 4,548,893 (Lee et al) describe amine-containing polymers for photosensitive materials used in non-thermal processes. Thermal processes using polyamic acids and vinyl polymers with pendant quaternary ammonium groups are described in U.S. Pat. No. 4,693,958 (Schwartz et al.). U.S. Pat. No. 5,512,418 (Ma) describes the use of polymers having cationic quaternary ammonium groups that are heat-sensitive. However, the materials described in this art require wet processing after imaging.

WO 92/09934 (Vogel et al.) describes photosensitive compositions containing a photoacid generator and a polymer with acid labile tetrahydropyranyl or activated ester groups. However, imaging of these compositions converts the imaged areas from hydrophobic to hydrophilic in nature.

In addition, EP-A 0 652 483 (Ellis et al.) describes lithographic printing plates imageable using IR lasers that do not require wet processing. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups. Imaging such compositions converts the imaged areas from hydrophobic to relatively more hydrophilic in nature, and thus requires imaging the background of the plate, which is generally a larger area. This can be a problem when imaging to the edge of the printing plate is desired.

U.S. Pat. No. 6,190,830 (Leon et al.), U.S. Pat. No. 6,190,831 (Leon et al.), and U.S. Pat. No. 5,985,514 (Zheng et al.) are directed to processless direct write imaging members that include an imaging layer containing heat sensitive ionomers. The polymer coatings are sensitized to infrared radiation by the incorporation of an infrared absorbing material such as an organic dye or a fine dispersion of carbon black. Upon exposure to a high intensity infrared laser, light absorbed by the organic dye or carbon black is converted to heat, thereby promoting a physical change in the ionomer (usually a change in hydrophilicity or hydrophobicity). The imaged materials can be used, for example, on conventional printing presses to provide negative images. Such printing plates have utility in the evolving "computer-to-plate" printing market.

Additional heat-sensitive compositions and imaging members that include polymer grafted carbon dispersions are described in copending U.S. Ser. No. 09/293,389 filed Apr. 16, 1999 and those that include heat-decomposable microcapsules are described in U.S. Pat. No. 5,569,573 (Takahashi et al.).

Some of the heat-sensitive polymers (ionomers) described in the noted patents have a tendency to undergo physical interactions or chemical reactions with carbon black dispersions, thus compromising the effectiveness of both polymers and heat-absorbing materials. In particular, while carbon black is an infrared radiation absorbing material of preference because of its low cost and absorption of light throughout the infrared region of the electromagnetic spectrum, its use also creates problems. For example, it cannot be readily dispersed out of water or the alcoholic solvents of choice. Special carbon black products that are designed to be water-dispersible (that is, have special surface functionalities), however, often agglomerate in the presence of charged polymers containing ionic groups due to chemical interactions.

Thus, the graphic arts industry is seeking an alternative means for providing direct-write lithographic imaging members that can be imaged without ablation, or the other problems noted above in relation to known processless direct write printing plates. It would also be desirable to have heat-sensitive imaging members that include components that are highly effective to convert light exposure into heat and that can be coated out of water or other environmentally suitable solvents without agglomeration.

SUMMARY OF THE INVENTION

The problems noted above are overcome with a heat-sensitive composition comprising:

a) a hydrophilic heat-sensitive ionomer, and b) latex polymer-carbon black composite particles.

This invention also provides a negative-working imaging member comprising a support and having disposed thereon a hydrophilic imaging layer that is prepared from the composition described above.

Still further, this invention includes a method of imaging comprising the steps of A) providing the negative-working imaging member described above, and B) imagewise exposing the imaging member to provide exposed and unexposed areas in the imaging layer of the imaging member, whereby the exposed areas are rendered more hydrophobic than the unexposed areas by heat provided by the imagewise exposure.

Still again, a method of printing comprises the steps of carrying out steps A and B noted above, and additionally:

C) contacting the imaging member with a lithographic printing ink and imagewise transferring that printing ink from the imaging member to a receiving material.

Still another embodiment of this invention is a lithographic printing plate comprising latex polymer-carbon black composite particles.

As used herein, the term "ionomer" refers to a charged polymer having at least 15 mol % of the recurring units negatively or positively charged.

The imaging members of this invention have a number of advantages and avoid the problems of previous printing plates. These advantages are achieved by using the latex polymer-carbon black composite particles described herein that provide improved compatibility with other components in the imaging layers. In preferred embodiments, the imaging members include a hydrophilic heat-sensitive polymer (ionomer) having recurring charged groups within the polymer backbone or chemically attached thereto. Such ionomers and groups are described in more detail below. Printing members formed from the imaging members of this invention are generally negative-working. Moreover, conventional alkaline development is not necessary with the preferred "switchable" imaging members of this invention.

Charged polymers that can be used in the preferred embodiments of this invention are typically coated out of water and water-miscible solvents such as methanol, solvents that readily dissolve these water-soluble or water-dispersible polymeric salts. Carbon black does not readily disperse in such solvents and in order to achieve aqueous dispersions, special concentrated carbon black products are required (for example, materials sold by Cabot Laboratories under the trade name CAB-O-JET).

We have found, however, that charged polymers and such ionic functionalized carbon particles are often not compatible with one another. The present invention solves this problem with the use of latex polymer-carbon black composite particles as the infrared absorbing material instead of conventional dispersed carbon particles. We have found that these pigmented particles are readily dispersed in water or water-miscible solvents such as alcohols, and that they do not agglomerate in the presence of ionomers. Furthermore, the carbon black in the composite particles is isolated sufficiently from other components in the imaging composition that deleterious chemical and physical interactions are minimized. The heat-sensitive compositions of this invention can be readily applied to suitable metal or polymer supports, and the resulting imaging members can function as improved thermal processless printing plates.

DETAILED DESCRIPTION OF THE INVENTION

A wide variety of imaging members is provided by the present invention. Such imaging members are imageable by radiation of some type to provide a printing surface that has oleophilic and non-oleophilic regions. In their simplest form, the imaging members (such as lithographic printing plates) include a suitable support having disposed thereon one or more layers that provide an imaging surface. In most instances, a hydrophilic imaging surface is rendered more hydrophobic, or a hydrophobic imaging surface is rendered more hydrophilic, upon imaging. At least one layer used for imaging comprises the latex polymer-carbon black composite particles described herein. These particles facilitate the absorption of suitable imaging radiation (usually infrared radiation) and conversion of that radiation into heat in the imaging layer(s). Preferably, the composite particles are dispersed in one or more polymers that are soluble in water or water-miscible organic solvents.

For example, the imaging members can be composed of a mixture of dissolvable polymers like those described in U.S. Pat. No. 5,372,915 (noted above) with the latex polymer-carbon black composite particles. Imaging of such imaging members is carried out using lasers and digital information, and conventional alkaline developers are used to provide the image used for lithographic printing.

Alternatively, the imaging members can be "ablatable" printing plates that are imaged by "ablating" one or more imaging layers using suitable high power infrared radiation. The latex polymer-carbon black composite particles are situated in one of the ablatable layers to facilitate radiation absorption and loosening of the ablatable material(s).

Preferably, the imaging members of the present invention are what are known in the art as "switchable" imaging members in which imaging radiation renders a hydrophilic imaging more hydrophobic, or a hydrophobic imaging surface more hydrophilic without ablation or the need to chemically remove non-imaged areas using alkaline developers.

The imaging members of this invention comprise a support and one or more layers thereon that preferably include a dried heat-sensitive composition of this invention. The support can be any self-supporting material including polymeric films, glass, ceramics, cellulosic materials (including papers), metals, or stiff papers, or a lamination of any of these materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 μm. Another preferred embodiment uses aluminum sheets having a thickness of from about 100 to about 600 μm. The support should resist dimensional change under conditions of use.

The support may also be a cylindrical support that includes printing cylinders on press as well as printing sleeves that are fitted over printing cylinders. The use of such supports to provide cylindrical imaging members is described in U.S. Pat. No. 5,713,287 (Gelbart). The heat-sensitive composition of this invention can be coated or sprayed directly onto the cylindrical surface that is an integral part of the printing press.

The support may be coated with one or more "subbing" layers to improve adhesion of the final assemblage. Examples of subbing layer materials include, but are not limited to, gelatin and other naturally occurring and synthetic hydrophilic colloids and vinyl polymers (such as vinylidene chloride copolymers) that are known for such purposes in the photographic industry, vinylphosphonic acid polymers, sol gel materials such as those prepared from alkoxysilanes (including glycidoxypropyltriethoxysilane and aminopropyltriethoxysilane), epoxy functional polymers, and various ceramics.

The backside of the support may be coated with antistatic agents and/or slipping layers or matte layers to improve handling and "feel" of the imaging member.

The imaging members, however, preferably have only one layer on the support, that is a heat-sensitive surface layer that is required for imaging. This hydrophilic layer is prepared from the heat-sensitive composition of this invention that includes one or more heat-sensitive ionomers and latex polymer-carbon black composite particles as a photothermal conversion material (described below). Because of the particular ionomer(s) used in the imaging layer, the exposed (imaged) areas of the layer are rendered more hydrophobic in nature. The unexposed areas remain hydrophilic in nature.

In the heat-sensitive imaging layer of the imaging member, only the one or more ionomers and latex polymer-carbon black composite particles are essential for imaging. The ionomers are generally comprised of recurring units, of which at least 15 mol % include ionic groups of the same charge. Preferably, at least 20 mol % of the recurring groups include ionic groups of the same ionic charge. Thus each of these polymers has a net positive or negative charge provided by these ionic groups.

The term "ionomer" is used herein to mean charged polymers or polymers that can be protonated or deprotonated depending upon pH.

Representative ionomers useful in the practice of this invention can be selected from one or more of four broad classes of materials:

I) crosslinked or uncrosslinked vinyl polymers comprising recurring units comprising positively-charged, pendant N-alkylated aromatic heterocyclic groups, II) crosslinked or uncrosslinked polymers comprising recurring organoonium groups, III) polymers comprising a pendant thiosulfate (Bunte salt) group, IV) polymers comprising recurring units comprising carboxy or carboxylate groups.

Each class of ionomers is described in turn. The imaging layer can include mixtures of ionomers from each class, or a mixture of one or more ionomers of two or more classes as long as the mixed ionomers are compatible with each other.

Class I Ionomers

The Class I ionomers generally have a molecular weight of at least 1000 and can be any of a wide variety of hydrophilic vinyl homopolymers and copolymers having the requisite positively-charged groups. They are prepared from ethylenically unsaturated polymerizable monomers using any conventional polymerization technique. Preferably, the polymers are copolymers prepared from two or more ethylenically unsaturated polymerizable monomers, at least one of which contains the desired pendant positively-charged group, and another monomer that is capable of providing other properties, such as crosslinking sites and possibly adhesion to the support. Procedures and reactants needed to prepare these polymers are well known. With the additional teaching provided herein, the known polymer reactants and conditions can be modified by a skilled artisan to attach a suitable cationic group.

The presence of a cationic group apparently provides or facilitates the "switching" of the imaging layer from hydrophilic to hydrophobic in the areas that have been exposed to heat in some manner, when the cationic group reacts with its counterion. The net result is the loss of charge. Such reactions are more easily accomplished when the anion is more nucleophilic and/or more basic. For example, an acetate anion is typically more reactive than a chloride anion. By varying the chemical nature of the anion, the reactivity of the heat-sensitive polymer can be modified to provide optimal image resolution for a given set of conditions (for example, laser hardware and power, and printing press needs) balanced with sufficient ambient shelf life. Useful anions include the halides, carboxylates, sulfates, borates and sulfonates. Representative anions include, but are not limited to, chloride, bromide, fluoride, acetate, tetrafluoroborate, formate, sulfate, p-toluenesulfonate and others readily apparent to one skilled in the art. The halides and carboxylates are preferred.

The aromatic cationic group is present in sufficient recurring units of the polymer so that the heat-activated reaction described above can provide desired hydrophobicity of the imaged printing layer. The groups can be attached along a principal backbone of the polymer, or to one or more branches of a polymeric network, or both. The aromatic groups generally comprise 5 to 10 carbon, nitrogen, sulfur or oxygen atoms in the ring (at least one being a positively-charged nitrogen atom), to which is attached a branched or unbranched, substituted or unsubstituted alkyl group. Thus, the recurring units containing the aromatic heterocyclic group can be represented by the following Structure I:

I

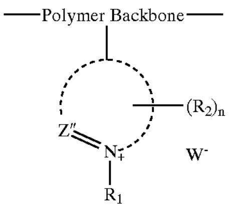

In this structure, $R_1$ is a branched or unbranched, substituted or unsubstituted alkyl group having from 1 to 12 carbon atoms (such as methyl, ethyl, n-propyl, isopropyl, t-butyl, hexyl, methoxymethyl, benzyl, neopentyl and dodecyl). Preferably, $R_1$ is a substituted or unsubstituted, branched or unbranched alkyl group having from 1 to 6 carbon atoms, and most preferably, it is substituted or unsubstituted methyl group.

$R_2$ can be a substituted or unsubstituted alkyl group (as defined above, and additionally a cyanoalkyl group, a hydroxyalkyl group or alkoxyalkyl group), substituted or unsubstituted alkoxy having 1 to 6 carbon atoms (such as methoxy, ethoxy, isopropoxy, oxymethylmethoxy, n-propoxy and butoxy), a substituted or unsubstituted aryl group having 6 to 14 carbon atoms in the ring (such as phenyl, naphthyl, anthryl, p-methoxyphenyl, xylyl, and alkoxycarbonylphenyl), halo (such as chloro and bromo), a substituted or unsubstituted cycloalkyl group having 5 to 8 carbon atoms in the ring (such as cyclopentyl, cyclohexyl and 4-methylcyclohexyl), or a substituted or unsubstituted heterocyclic group having 5 to 8 atoms in the ring including at least one nitrogen, sulfur or oxygen atom in the ring (such as pyridyl, pyridinyl, tetrahydrofuranyl and tetrahydropyranyl). Preferably, $R_2$ is substituted or unsubstituted methyl or ethyl group.

Z" represents the carbon and any additional nitrogen, oxygen, or sulfur atoms necessary to complete the 5- to 10-membered aromatic N-heterocyclic ring that is attached to the polymeric backbone. Thus, the ring can include two or more nitrogen atoms in the ring (for example, N-alkylated diazinium or imidazolium groups), or N-alkylated nitrogen-containing fused ring systems including, but not limited to, pyridinium, quinolinium, isoquinolinium acridinium, phenanthradinium and others readily apparent to one skilled in the art.

$W^-$ is a suitable anion as described above. Most preferably it is acetate or chloride.

Also in Structure I, n is 0 to 6, and is preferably 0 or 1. Most preferably, n is 0.

The aromatic heterocyclic ring can be attached to the polymeric backbone at any position on the ring. Preferably, there are 5 or 6 atoms in the ring, one or two of which are nitrogen. Thus, the N-alkylated nitrogen containing aromatic group is preferably imidazolium or pyridinium and most preferably it is imidazolium.

The recurring units containing the cationic aromatic heterocycle can be provided by reacting a precursor polymer containing unalkylated nitrogen containing heterocyclic units with an appropriate alkylating agent (such as alkyl sulfonate esters, alkyl halides and other materials readily apparent to one skilled in the art) using known procedures and conditions.

Preferred Class I ionomers can be represented by the following Structure II:

II

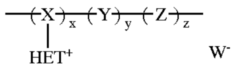

wherein X represents recurring units to which the N-alkylated nitrogen containing aromatic heterocyclic groups (represented by $HET^+$) are attached, Y represents recurring units derived from ethylenically unsaturated polymerizable monomers that may provide active sites for crosslinking using any of various crosslinking mechanisms (described below), $W^-$ is a suitable anion as described above, and Z represents recurring units derived from any additional ethylenically unsaturated polymerizable monomers. The various repeating units are present in suitable amounts, as represented by x being from about 15 to 100 mol %, y being from about 0 to about 20 mol %, and z being from 0 to 85 mol %. Preferably, x is from about 20 to about 98 mol %, y is from about 2 to about 10 mol % and z is from 0 to about 70 mol %.

Crosslinking of the ionomers can be provided in a number of ways. There are numerous monomers and methods for crosslinking that are familiar to one skilled in the art. Some representative crosslinking strategies include, but are not necessarily limited to:

a) reacting an amine or carboxylic acid or other Lewis basic units with diepoxide crosslinkers, b) reacting an epoxide units within the polymer with difunctional amines, carboxylic acids, or other difunctional Lewis basic unit, c) irradiative or radical-initiated crosslinking of double bond-containing units such as acrylates, methacrylates, cinnamates, or vinyl groups, d) reacting a multivalent metal salts with ligating groups within the polymer (the reaction of zinc salts with carboxylic acid-containing polymers is an example), e) using crosslinkable monomers that react via the Knoevenagel condensation reaction, such as (2-acetoacetoxy)ethyl acrylate and methacrylate, f) reacting an amine, thiol, or carboxylic acid groups with a divinyl compound (such as bis (vinylsulfonyl) methane) via a Michael addition reaction, g) reacting a carboxylic acid units with crosslinkers having multiple aziridine units, h) reacting a crosslinkers having multiple isocyanate units with amines, thiols, or alcohols within the polymer, i) mechanisms involving the formation of interchain sol-gel linkages [such as the use of the 3-(trimethoxysilyl) propylmethacrylate monomer], j) oxidative crosslinking using an added radical initiator (such as a peroxide or hydroperoxide), k) autooxidative crosslinking, such as employed by alkyd resins, l) sulfur vulcanization, and m) processes involving ionizing radiation.

Monomers having crosslinkable groups or active crosslinkable sites (or groups that can serve as attachment points for crosslinking additives, such as epoxides) can be copolymerized with the other monomers noted above. Such monomers include, but are not limited to, 3-(trimethoxysilyl)propyl acrylate or methacrylate, cinnamoyl acrylate or methacrylate, N-methoxymethyl methacrylamide, N-aminopropylacrylamide hydrochloride, acrylic or methacrylic acid and hydroxyethyl methacrylate.

Additional monomers that provide the repeating units represented by "Z" in the Structure II above include any useful hydrophilic or oleophilic ethylenically unsaturated polymerizable monomer that may provide desired physical or printing properties to the hydrophilic imaging layer. Such monomers include, but are not limited to, acrylates, methacrylates, isoprene, acrylonitrile, styrene and styrene derivatives, acrylamides, methacrylamides, acrylic or methacrylic acid and vinyl halides.

Representative Class I ionomers are identified below as Polymers 1, 3, 4, and 6. Mixtures of these polymers can also be used. Polymers 2 and 5 below are precursors to useful Class I ionomers. Further details of these ionomers and methods for their preparation are provided in U.S. Pat. No. 6,180,831 (noted above).

Polymer 1: Poly (1-vinyl-3-methylimidazolium chloride-co-N-(3-aminopropyl)methacrylamide hydrochloride), Polymer 2: Poly(methyl methacrylate-co-4-vinylpyridine), Polymer 3: Poly(methyl methacrylate-co-N-methyl-4-vinylpyridinium formate), Polymer 4: Poly(methyl methacrylate-co-N-butyl-4-vinylpyridinium formate), Polymer 5: Poly(methyl methacrylate-co-2-vinylpyridine), and Polymer 6: Poly(methyl methacrylate-co-N-methyl-2-vinylpyridinium formate).

Class II Ionomers

The Class II ionomers also generally have a molecular weight of at least 1000. They can be any of a wide variety of vinyl or non-vinyl homopolymers and copolymers.

Non-vinyl ionomers of Class II include, but are not limited to, polyesters, polyamides, polyamide-esters, polyarylene oxides and derivatives thereof, polyurethanes, polyxylylenes and derivatives thereof, silicon-based sol gels (solsesquioxanes), polyamidoamines, polyimides, polysulfones, polysiloxanes, polyethers, poly(ether ketones), poly(phenylene sulfide) ionomers, polysulfides and polybenzimidazoles. Preferably, such non-vinyl polymers are silicon based sol gels, polyarylene oxides, poly (phenylene sulfide) ionomers or polyxylylenes, and most preferably, they are poly(phenylene sulfide) ionomers. Procedures and reactants needed to prepare all of these types of polymers are well known. With the additional teaching provided herein, the known polymer reactants and conditions can be modified by a skilled artisan to incorporate or attach a suitable cationic organoonium moiety.

Silicon-based sol gels useful in this invention can be prepared as a crosslinked polymeric matrix containing a silicon colloid derived from di-, tri- or tetraalkoxy silanes. These colloids are formed by methods described in U.S. Pat. No. 2,244,325 (Bird), U. S. Pat. No. 2,574,902 (Betchtold et al.), and U. S. Pat. No. 2,597,872 (Iler). Stable dispersions of such colloids can be conveniently purchased from companies such as the DuPont Company. A preferred sol-gel uses N-trimethoxysilylpropyl-N,N,N-trimethylammonium acetate both as the crosslinking agent and as the polymer layer forming material.

The presence of an organoonium moiety that is chemically incorporated into the ionomer in some fashion apparently provides or facilitates the "switching" of the imaging layer from hydrophilic to oleophilic in the exposed areas upon exposure to energy that provides or generates heat, when the cationic moiety reacts with its counterion. The net result is the loss of charge. Such reactions are more easily accomplished when the anion of the organoonium moiety is more nucleophilic and/or more basic, as described above for the Class I polymers.

The organoonium moiety within the polymer can be chosen from a trisubstituted sulfur moiety (organosulfonium), a tetrasubstituted nitrogen moiety (organoammonium), or a tetrasubstituted phosphorous moiety (organophosphonium). The tetrasubstituted nitrogen (organoammonium) moieties are preferred. This moiety can be chemically attached to (that is, pendant) the polymer backbone, or incorporated within the backbone in some fashion, along with the suitable counterion. In either embodiment, the organoonium moiety is present in sufficient repeating units of the polymer (at least 15 mol %) so that the heat-activated reaction described above can occur to provide desired hydrophobicity of the imaging layer. When chemically attached as a pendant group, the organoonium moiety can be attached along a principal backbone of the polymer, or to one or more branches of a polymeric network, or both. When chemically incorporated within the polymer backbone, the moiety can be present in either cyclic or acyclic form, and can also form a branching point in a polymer network. Preferably, the organoonium moiety is provided as a pendant group along the polymeric backbone. Pendant organoonium moieties can be chemically attached to the polymer backbone after polymer formation, or functional groups on the polymer can be converted to organoonium moieties using known chemistry. For example, pendant quaternary ammonium groups can be provided on a polymeric backbone by the displacement of a "leaving group" functionality (such as a halogen) by a tertiary amine nucleophile. Alternatively, the organoonium group can be present on a monomer that is then polymerized or derived by the alkylation of a neutral heteroatom unit (trivalent nitrogen or phosphorous group or divalent sulfur group) already incorporated within the polymer.

The organoonium moiety is substituted to provide a positive charge. Each substituent must have at least one carbon atom that is directly attached to the sulfur, nitrogen or phosphorus atom of the organoonium moiety. Useful substituents include, but are not limited to, substituted or unsubstituted alkyl groups having 1 to 12 carbon atoms and preferably from 1 to 7 carbon atoms (such as methyl, ethyl, n-propyl, isopropyl, t-butyl, hexyl, methoxyethyl, isopropoxymethyl, substituted or unsubstituted aryl groups (phenyl, naphthyl, p-methylphenyl, m-methoxyphenyl, p-chlorophenyl, p-methylthiophenyl, p-N,N-dimethylaminophenyl, xylyl, methoxycarbonylphenyl and cyanophenyl), and substituted or unsubstituted cycloalkyl groups having 5 to 8 carbon atoms in the carbocyclic ring (such as cyclopentyl, cyclohexyl, 4-methylcyclohexyl and 3-methylcyclohexyl). Other useful substituents would be readily apparent to one skilled in the art, and any combination of the expressly described substituents is also contemplated.

The organoonium moieties include any suitable anion as described above for the Class I ionomers. The halides and carboxylates are preferred.

Class II ionomers can comprise both vinyl and non-vinyl backbones. Both types are composed of recurring units having one or more types of organoonium group. For example, such a ionomer can have recurring units with both organoammonium groups and organosulfonium groups. It is also not necessary that all of the organoonium groups have the same alkyl substituents. Useful anions in these ionomers are the same as those described above for the non-vinyl polymers. Similarly, the halides and carboxylates are preferred.

The organoonium group is present in sufficient recurring units of the ionomer so that the heat-activated reaction described above can occur to provide desired hydrophobicity of the imaged printing layer. The group can be attached along a principal backbone of the polymer, or to one or more branches of a polymeric network, or both. Pendant groups can be chemically attached to the polymer backbone after polymer formation using known chemistry. For example, pendant organoammonium, organophosphonium or organosulfonium groups can be provided on a polymeric backbone by the nucleophilic displacement of a pendant leaving group (such as a halide or sulfonate ester) on the polymeric chain by a trivalent amine, divalent sulfur or trivalent phosphorous nucleophile. Pendant onium groups can also be provided by alkylation of corresponding pendant neutral heteroatom groups (nitrogen, sulfur or phosphorous) using any commonly used alkylating agent such as alkyl sulfonate esters or alkyl halides. Alternatively a monomer precursor containing the desired organoammonium, organophosphonium or organosulfonium group may be polymerized to yield the desired polymer.

The organoammonium, organophosphonium or organosulfonium group in the vinyl ionomer provides the desired positive charge. Generally, preferred pendant organoonium groups can be illustrated by the following Structures III, IV, and V:

III

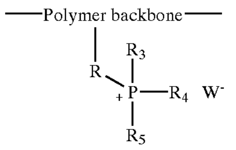

IV

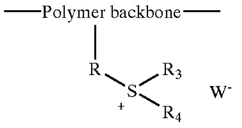

V

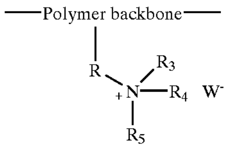

wherein R is a substituted or unsubstituted alkylene group having 1 to 12 carbon atoms that can also include one or more oxy, thio, carbonyl, amido or alkoxycarbonyl groups with the chain (such as methylene, ethylene, isopropylene, methylenephenylene, methyleneoxymethylene, n-butylene, and hexylene), a substituted or unsubstituted arylene group having 6 to 10 carbon atoms in the ring (such as phenylene, naphthylene, xylylene, and 3-methoxyphenylene), or a substituted or unsubstituted cycloalkylene group having 5 to 10 carbon atoms in the ring (such as 1,4-cyclohexylene, and 3-methyl-1,4-cyclohexylene). In addition, R can be a combination of two or more of the defined substituted or unsubstituted alkylene, arylene and cycloalkylene groups. Preferably, R is a substituted or unsubstituted ethyleneoxycarbonyl or phenylenemethylene group. Other useful substituents not listed herein could include combinations of any of those groups listed above as would be readily apparent to one skilled in the art.

$R_3$, $R_4$, and $R_5$ are independently substituted or unsubstituted alkyl group having 1 to 12 carbon atoms (such as methyl, ethyl, n-propyl, isopropyl, t-butyl, hexyl, hydroxymethyl, methoxymethyl, benzyl, methylenecarboalkoxy, and a cyanoalkyl), a substituted or unsubstituted aryl group having 6 to 10 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl, and cyanophenyl), or a substituted or unsubstituted cycloalkyl group having 5 to 10 carbon atoms in the carbocyclic ring (such as 1,3- or 1,4-cyclohexyl). Alternatively, any two of $R_3$, $R_4$, and $R_5$ can be combined to form a substituted or unsubstituted heterocyclic ring with the charged phosphorus, sulfur or nitrogen atom, the ring having 4 to 8 carbon, nitrogen, phosphorus, sulfur or oxygen atoms in the ring. Such heterocyclic rings include, but are not limited to, substituted or unsubstituted morpholinium, piperidinium, and pyrrolidinium groups for Structure V. Other useful substituents for these various groups would be readily apparent to one skilled in the art, and any combinations of the expressly described substituents are also contemplated.

Preferably, $R_3$, $R_4$, and $R_5$ are independently substituted or unsubstituted methyl or ethyl groups.

$W^-$ is any suitable anion as described above for the Class I polymers. Acetate and chloride are preferred anions.

Ionomers containing quaternary ammonium groups as described herein are most preferred vinyl Class II polymers.

In preferred embodiments, the vinyl Class II ionomers useful in the practice of this invention can be represented by the following Structure VI:

VI

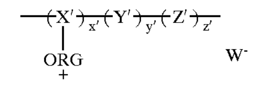

wherein X' represents recurring units to which the organoonium groups ("ORG") are attached, Y' represents recurring units derived from ethylenically unsaturated polymerizable monomers that may provide active sites for crosslinking using any of various crosslinking mechanisms (described below), $W^-$ is a suitable anion (as defined above), and Z' represents recurring units derived from any additional ethylenically unsaturated polymerizable monomers. The various recurring units are present in suitable amounts, as represented by x' being from about 15 to about 99 mol %, y' being from about 1 to about 20 mol %, and z' being from 0 to about 84 mol %. Preferably, x' is from about 20 to about 98 mol %, y' is from about 2 to about 10 mol % and z' is from 0 to about 70 mol %.

Crosslinking of the vinyl ionomer can be achieved in the same way as described above for the Class I polymers.

Additional monomers that provide the additional recurring units represented by Z' in Structure VI include any useful hydrophilic or oleophilic ethylenically unsaturated polymerizable monomer that may provide desired physical or printing properties to the imaging layer. Such monomers include, but are not limited to, acrylates, methacrylates, acrylonitrile, isoprene, styrene and styrene derivatives, acrylamides, methacrylamides, acrylic or methacrylic acid and vinyl halides.

Representative Class II non-vinyl ionomers are identified herein below as Polymers 7–8 and 10. Mixtures of these polymers can also be used. Polymer 9 is a precursor to Polymer 10. Representative vinyl ionomers of Class II include Polymers 11–18 as identified herein below, and Polymer 14 is most preferred. A mixture of any two or more of these ionomers can also by used. Further details of such ionomers and method for preparing them are provided in U.S. Pat. No. 6,109,830 (noted above).

Polymer 7: Poly(p-xylidenetetrahydrothiophenium chloride),

Polymer 8: Poly[phenylene sulfide-co-methyl(4-thiophenyl)sulfonium chloride],

Polymer 9: Brominated poly(2,6-dimethyl-1,4-phenylene oxide),

Polymer 10: Dimethyl sulfonium bromide derivative of poly(2,6-dimethyl-1,4-phenylene oxide), Polymer 11: Poly[methyl methacrylate-co-2-trimethylammoniumethyl methacrylic chloride-co-N-(3-aminopropyl)methacrylamide hydrochloride], Polymer 12: Poly[methyl methacrylate-co-2-trimethylammoniumethyl methacrylic acetate-co-N-(3-aminopropyl)methacrylamide], Polymer 13: Poly[methyl methacrylate-co-2-trimethylammoniumethyl methacrylic fluoride-co-N-(3-aminopropyl)methacrylamide hydrochloride], Polymer 14: Poly[vinylbenzyl trimethylammonium chloride-co-N-(3-aminopropyl)methacrylamide hydrochloride], Polymer 15: Poly([vinylbenzyltrimethyl-phosphonium acetate-co-N-(3-aminopropyl) methacrylamide hydrochloride], Polymer 16: Poly [dimethyl-2-(methacryloyloxy) ethylsulfonium chloride-co-N-(3-aminopropyl) methacrylamide hydrochloride], Polymer 17: Poly [vinylbenzyldimethylsulfonium methylsulfate], and Polymer 18: Poly[vinylbenzyldimethylsulfonium chloride].

Class III Ionomers

Each of the Class III ionomers has a molecular weight of at least 1000, and preferably of at least 5000. For example, the ionomers can be vinyl homopolymers or copolymers prepared from one or more ethylenically unsaturated polymerizable monomers that are reacted together using known polymerization techniques and reactants. Alternatively, they can be addition homopolymers or copolymers (such as polyethers) prepared from one or more heterocyclic monomers that are reacted together using known polymerization techniques and reactants. Additionally, they can be condensation type polymers (such as polyesters, polyimides, polyamides or polyurethanes) prepared using known polymerization techniques and reactants. Whatever the type of polymers, at least 15 mol % (preferably 20 mol %) of the total recurring units in the polymer comprise the necessary heat-activatable thiosulfate groups.

The Class III ionomers useful in the practice of this invention can be represented by the following Structure VII wherein the thiosulfate group (or Bunte salt) is a pendant group:

VII

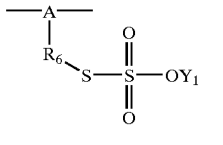

wherein A represents a polymeric backbone, $R_6$ is a divalent linking group, and $Y_1$ is hydrogen or a cation.

Useful polymeric backbones include, but are not limited to, vinyl polymers, polyethers, polyimides, polyamides, polyurethanes and polyesters. Preferably, the polymeric backbone is a vinyl polymer or polyether.

Useful $R_6$ linking groups include —$(COO)_{n'}(Z_1)_m$— wherein n' is 0 or 1, m is 0 or 1, and $Z_1$ is a substituted or unsubstituted alkylene group having 1 to 6 carbon atoms (such as methylene, ethylene, n-propylene, isopropylene, butylenes, 2-hydroxypropylene and 2-hydroxy-4-azahexylene) that can have one or more oxygen, nitrogen or sulfur atoms in the chain, a substituted or unsubstituted arylene group having 6 to 14 carbon atoms in the aromatic ring (such as phenylene, naphthalene, anthracylene and xylylene), or a substituted or unsubstituted arylenealkylene (or alkylenearylene) group having 7 to 20 carbon atoms in the chain (such as p-methylenephenylene, phenylenemethylene-phenylene, biphenylene and phenyleneisopropylenephenylene). In addition, $R_6$ can be an alkylene group, an arylene group, in an arylenealkylene group as defined above for $Z_1$.

Preferably, $R_6$ is an alkylene group of 1 to 3 carbon atoms, an arylene group of 6 carbon atoms in the aromatic ring, an arylenealkylene group of 7 or 8 carbon atoms in the chain, or —$COO(Z_1)_m$—wherein $Z_1$ is methylene, ethylene or phenylene. Most preferably, $R_6$ is phenylene, methylene or —COO—.

$Y_1$ is hydrogen, ammonium ion, or a metal ion (such as sodium, potassium, magnesium, calcium, cesium, barium, zinc or lithium ion). Preferably, $Y_1$ is hydrogen, sodium ion, ammonium ion, or potassium ion.

As the thiosulfate group is generally arranged pendant to the backbone, preferably it is part of an ethylenically unsaturated polymerizable monomer that can be polymerized using conventional techniques to form vinyl homopolymers of the thiosulfate-containing recurring units, or vinyl copolymers when copolymerized with one or more additional ethylenically unsaturated polymerizable monomers. The thiosulfate-containing recurring units generally comprise at least 15 mol % of all recurring units in the polymer, preferably they comprise from about 20 to 100 mol % of all recurring units. A polymer can include more than one type of repeating unit containing a thiosulfate group as described herein.

Ionomers having the above-described thiosulfate group are believed to crosslink and to switch from hydrophilic thiosulfate to hydrophobic disulfide (upon loss of sulfate) with heating.

Thiosulfate-containing molecules (or Bunte salts) can be prepared from the reaction between an alkyl halide and thiosulfate salt as taught by Bunte, *Chem.Ber.* 7, 646, 1884. Polymers containing thiosulfate groups can either be prepared from functional monomers or from preformed polymers. Polymers can also be prepared from preformed polymers in a similar manner as described in U.S. Pat. No. 3,706,706 (Vandenberg). Thiosulfate-containing molecules can also be prepared by reaction of an alkyl epoxide with a thiosulfate salt, or between an alkyl epoxide and a molecule containing a thiosulfate moiety (such as 2-aminoethanethiosulfuric acid), and the reaction can be performed either on a monomer or polymer as illustrated by Thames, *Surf. Coating,* 3 (Waterborne Coat.), Chapter 3, pp. 125–153, Wilson et al. (Eds.).

Details for making ethylenically unsaturated polymerizable monomers and Class III ionomers are provided in U.S. Pat. No. 5,985,514 (noted above).

Vinyl polymers can be prepared by copolymerizing monomers containing the thiosulfate functional groups with one or more other ethylenically unsaturated polymerizable monomers to modify polymer chemical or functional properties, to optimize imaging member performance, or to introduce additional crosslinking capability.

Useful additional ethylenically unsaturated polymerizable monomers include, but are not limited to, acrylates (including methacrylates) such as ethyl acrylate, n-butyl acrylate, methyl methacrylate and t-butyl methacrylate, acrylamides (including methacrylamides), an acrylonitrile (including methacrylonitrile), vinyl ethers, styrenes, vinyl acetate, dienes (such as ethylene, propylene, 1,3-butadiene and isobutylene), vinyl pyridine and vinylpyrrolidone. Acrylamides, acrylates and styrenes are preferred.

Representative Class III ionomers include the following Polymers 19–27:

Polymer 19: Poly(chloromethyl-ethylene oxide-co-sodium thiosulfate methyl-ethylene oxide), Polymer 20: Poly(vinyl benzyl thiosulfate sodium salt-co-methyl methacylate), Polymer 21: Poly[vinyl benzyl thiosulfate sodium salt-co-N-(3-aminopropyl)methacylamide hydrochloride], Polymer 22: Poly(vinyl benzyl thiosulfate sodium salt-co-styrene), Polymer 23: Poly(vinyl benzyl thiosulfate sodium salt), Polymer 24: Poly[vinyl benzyl thiosulfate sodium salt-co-N-(3-aminopropyl)methacrylamide hydrochloride], Polymer 25: Poly[2-hydroxy-3-sodium thiosulfate-propyl methacrylate-co-2-(methacryloyloxy)ethyl acetoacetate], Polymer 26: Poly(2-sodium thiosulfate-ethyl methacrylate), and Polymer 27: Poly(4-aza-2-hydroxy-6-sodium thiosulfate-hexyl methacrylate).

Class IV Ionomers

Additional heat-sensitive ionomers useful in this invention comprise random recurring units at least some of which comprise carboxy (free acid) or various carboxylates (salts). The Ionomers generally have a molecular weight of at least 3,000 and preferably of at least 20,000.

The ionomers randomly comprise one or more types of carboxy- or carboxylate-containing recurring units (or equivalent anhydride units) identified as "$A_1$" below in Structure VIII and optionally one or more other recurring units (non-carboxylated) denoted as "$B_1$" in Structure VIII.

The carboxy or carboxylate group can be linked directly to the polymer backbone that is derived from the "$A_1$" monomers, or they can be connected by a linking group identified as "$X_1$" in Structure VIII below. This linking group can be any divalent aliphatic, alicyclic or aromatic group that does not adversely affect the polymer's heat-sensitivity. For example, "$X_1$" can be a substituted or unsubstituted alkylene group having 1 to 16 carbon atoms (such as methylene, ethylene, isopropylene, n-propylene and n-butylene), a substituted or unsubstituted arylene group having 6 to 10 carbon atoms in the arylene ring (such as m- or p-phenylene and naphthylenes), substituted or unsubstituted combinations of alkylene and arylene groups (such arylenealkylene, arylenealkylenearylene and alkylenearylenealkylene groups), and substituted or unsubstituted N-containing heterocyclic groups. Any of these defined groups can be connected in a linking chain with one or more amino, carbonamido, oxy, thio, amido, oxycarbonyl, aminocarbonyl, alkoxycarbonyl, alkanoyloxy, alkanoylamino, or alkaminocarbonyl groups. Particularly useful "$X_1$" linking groups contains an ester or amide connected to an alkylene group or arylene group (as defined above), such as when the ester and amide groups are directly bonded to "$A_1$".

In some embodiments of Class IV polymers, the $X_1$ linking groups include one or more electron withdrawing groups (groups with a positive Hammett $\sigma_m$) that are either within the linking chain or attached thereto. Hammett $\sigma_m$ values are well known in the art for many chemical groups and is defined in numerous publications including *Prog. Phys. Org. Chem.* 2, 323, 1964, Carpenter, B. K., *Determination of Organic Reaction Mechanisms,* John Wiley & Sons, New York, 1984, pp. 144–146, and *J. Med. Chem.,* 16, 1207, 1973. For example, the $X_1$ linking groups can include one or more of the following groups either within the linking chain or attached thereto: —O—, —S—, —Se—, —$NR_{11}$—, —CO—, —$SO_2$, —PO—, —$SiR_{11}R_{12}$—, —CS—, halo, cyano, —$OR_{11}$, —$OCOR_{11}$, —$OCOOR_{11}$, —$OCONR_{11}R_{12}$, —$OSO_2R_{11}$, —$COR_{11}$, —$COOR_{11}$, —$CONR_{11}R_{12}$, —$NR_{11}R_{12}$, —$NR_{11}COR_{12}$, —$NR_{11}COOR_{12}$, —$NR_{11}CONR_{11}R_{12}$, —$SR_{11}$, —$SOR_{11}$, —$SO_2R_{11}$, —$SO_3R_{11}$, and other groups that would be readily apparent to one skilled in the art. $R_{11}$, and $R_{12}$ are independently any suitable organic monovalent substituent that would be readily apparent to one skilled in the art. Preferred electron withdrawing groups that can be a part of $X_1$ include —$SO_2$, cyano, —$COR_{11}$, and —$SOR_{11}$. Specific examples of electron withdrawing groups are also shown in EP-A-1,075,942 (Fuji Photo), pages 10–12, incorporated herein by reference.

In Structure VIII below, p is 0 or 1, and preferably p is 0.

VIII

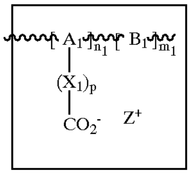

Additional monomers (non-carboxylate monomers) that provide the recurring units represented by "$B_1$" in Structure VIII above include any useful hydrophilic or oleophilic ethylenically unsaturated polymerizable comonomers that may provide desired physical or printing properties of the surface imaging layer or which provide crosslinkable functionalities. One or more "$B_1$" monomers may be used to provide these recurring units, including but not limited to, acrylates, methacrylates, styrene and its derivatives, acrylamides, methacrylamides, olefins, vinyl halides, and any monomers (or precursor monomers) that do not contain carboxy or carboxylate groups.

The carboxy- or carboxylate-containing ionomer may be chosen or derived from a variety of polymers and copolymer classes including, but not necessarily limited to polyamic acids, polyesters, polyamides, polyurethanes, silicones, proteins (such as modified gelatins), polypeptides, and polymers and copolymers based on ethylenically unsaturated polymerizable monomers such as acrylates, methacrylates, acrylamides, methacrylamides, vinyl ethers, vinyl esters, alkyl vinyl ethers, maleic acid/anhydride, itaconic acid/anhydride, styrenics, acrylonitrile, and olefins such as butadiene, isoprene, propylene, and ethylene. A parent carboxy-containing polymer may contain more than one type of carboxylic acid-containing monomer. Certain monomers, such as maleic acid/anhydride and itaconic acid/anhydride may contain more than one carboxylic acid unit. Preferably, the parent carboxylic acid-containing polymer is an addition polymer or copolymer containing acrylic acid, methacrylic acid, maleic acid or anhydride, or itaconic acid or anhydride or a conjugate base or hydrolysis product thereof In Structure VIII, $n_1$ represents about 25 to 100 mol % (preferably from about 50 to 100 mol %), and $m_1$ represents 0 to about 75 mol % (preferably from 0 to about 50 mol %).

While Structure VIII could be interpreted to show ionomers derived from only two ethylenically unsaturated polymerizable monomers, it is intended to include terpolymers and other polymers derived from more than two monomers.

The carboxy or carboxylate groups must be present in the heat-sensitive ionomer useful in this invention in such a quantity as to provide a minimum of one mole of the carboxy or carboxylate groups per 1300 g of polymer and a maximum of one mole of carboxy or carboxylate groups per 132 g of polymer. Preferably, this ratio (moles of carboxy or carboxylate groups to grams of polymer) is from about 1:600 to about 1:132 and more preferably, this ratio is from about 1:500 to about 1:132. This parameter is readily determined from knowledge of the molecular formula of a given ionomer.

In Structure VIII noted above, $Z^+$ is any suitable monovalent cation including but not limited to hydrogen, alkali metal cations (such as sodium or potassium), primary, secondary, tertiary, or quaternary ammonium ions, phosphonium ions, sulfonium ions, pyridinium, morpholinium, and alkyl imidazolium ions. Sodium, potassium, and quaternary ammonium ions are preferred, and quaternary ammonium ions (described below) are most preferred. The ionomer can be derived from monomers that comprise different cations so that the ionomer chain has various cations distribution throughout the molecule. Preferably, all of the cations are the same.

A most preferred $Z^+$ cation is a quaternary ammonium ion defined as $—N^+(R_7)(R_8)(R_9)(R_{10})$ in which $R_7$, $R_8$, $R_9$ and $R_{10}$ are independently substituted or unsubstituted alkyl groups having 1 to 12 carbon atoms [such as methyl, ethyl, n-propyl, isopropyl, t-butyl, hexyl, hydroxyethyl, 2-propanonyl, ethoxycarbonymethyl, benzyl, substituted benzyl (such as 4-methoxybenzyl, o-bromobenzyl, and p-trifluoromethylbenzyl), and cyanoalkyl], or substituted or unsubstituted aryl groups having 6 to 14 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl, and cyanophenyl). Alternatively, any two, three or four of $R_7$, $R_8$, $R_9$ and $R_{10}$ can be combined to form a ring (or two rings for four substituents) with the quaternary nitrogen atom, the ring having 5 to 14 carbon, oxygen, sulfur and nitrogen atoms in the ring. Such rings include, but are not limited to, morpholine, piperidine, pyrrolidine, carbazole, indoline, and isoindoline rings. The nitrogen atom can also be located at the tertiary position of the fused ring. Other useful substituents for these various groups would be readily apparent to one skilled in the art, and any combinations of the expressly described substituents are also contemplated.

Alternatively, multi-cationic ionic species containing more than one quaternary ammonium unit covalently bonded together and having charges greater than +1 (for example +2 for diammonium ions, and +3 for triammonium ions) may be used in this invention.

Preferably, the nitrogen of the quaternary ammonium ion is directly bonded to one or more benzyl groups or one or two phenyl groups. Alternatively, the nitrogen atom is part of one or two five-membered rings, or one or two indoline or isoindoline rings and has a molecular weight of less than 400.

The use of a spiro ammonium cation in which the nitrogen lies at the vertex of two intersecting rings is especially preferred. When a carboxylate polymer containing such an ammonium counterion is thermally imaged, small molecule amines are not given off and hence the problem of odor during imaging is alleviated. Similarly, the use of a benzyl-tris-hydroxyethyl ammonium ion may result in the release of triethanolamine that is odorless and relatively benign.

The heat-sensitive ionomers of Class IV may be readily prepared using many methods that will be obvious to one skilled in the art. Many quaternary ammonium salts and carboxylic acid or anhydride-containing polymers are commercially available. Others can be readily synthesized using preparative techniques that would be obvious to one skilled in the art. Carboxy- or anhydride-containing polymers can be converted to the desired quaternary ammonium carboxylate salts by a variety of methods including, but not necessarily limited to:

1) the reaction of a carboxylic acid- or acid anhydride-containing polymer with the hydroxide salt of the desired quaternary ammonium ion,
2) the use of ion exchange resin containing the desired quaternary ammonium ion,
3) the addition of the desired ammonium ion to a solution of the carboxylic acid-containing polymer or a salt thereof followed by dialysis,
4) the addition of a volatile acid salt of the desired quaternary ammonium ion (such as an acetate or formate salt) to the carboxylic acid-containing polymer followed by evaporation of the volatile component upon drying,
5) electrochemical ion exchange techniques,
6) the polymerization of monomers containing the desired quaternary ammonium carboxylate units, and
7) the combination of a specific salt of the carboxylic acid-containing polymer and a specific quaternary ammonium salt, both chosen such that the undesired counterions will form an insoluble ionic compound in a chosen solvent and precipitate.

Preferably, the first method is employed.

Although it is especially preferred that all of the carboxy (or latent carboxylic acid) functionalities of the ionomer are converted to the desired salts (especially quaternary ammonium salts), imaging compositions in which the ionomer is incompletely converted may still retain satisfactory imageability. Preferably, at least 50 monomer percent of the carboxylic acid (or equivalent anhydride) containing monomers are reacted to form the desired carboxylates.

Preferred embodiments of Class IV ionomers are crosslinked. Crosslinking can be provided in a number of ways as described above for the Class I ionomers. Ethylenically unsaturated polymerizable monomers having crosslinkable groups (or groups that can serve as attachment points for crosslinking additives) can be copolymerized with the other monomers as noted above. Such monomers include, but are not limited to, 3-(trimethylsilyl)propyl acryl ate or methacrylate, cinnamoyl acryl ate or methacrylate, N-methoxymethyl methacrylamide, N-aminopropylmethacrylamide hydrochloride, acrylic or methacrylic acid and hydroxyethyl methacrylate.

Preferably, crosslinking is provided by the addition of an epoxy-containing resin to a quaternary ammonium carboxylate ionomer or by the reaction of a bisvinylsulfonyl compound with amine containing units (such as N-aminopropylmethacrylamide) within the ionomer. CR-5L (an epoxide resin sold by Esprit Chemicals) can be used for this purpose.

In still more preferred embodiments of Class IV ionomers, the quaternary ammonium counterion of the carboxylate functionalities may be any ammonium ion in which the nitrogen is covalently bound to a total of four alkyl or aryl substituents as defined above, provided at least one of the four substituents is a substituted alkylene($C_1$–$C_3$)phenyl group.

More particularly in such embodiments, in Structure VIII noted above, $Z^+$ is a quaternary ammonium ion in which $R_7$, $R_8$ and $R_9$ are independently linear or branched unsubstituted alkyl groups of 1 to 3 carbon atoms, or linear or branched hydroxyalkyl groups of 1 to 3 carbon atoms that comprise 1 to 3 hydroxy groups as the only substituents (generally only one hydroxy group per carbon atom). More preferably, these radicals are independently methyl, hydroxymethyl, ethyl, 2-hydroxyethyl, 1-hydroxyethyl, or 1,2-dihydroxyethyl and most preferably, they are either methyl or 2-hydroxyethyl.

In this group of preferred Class IV ionomers, $R_{10}$ is a substituted alkylenephenyl group that has at least one substituent on either the alkylene or phenyl moiety of the group. More preferably, the one or more substituents are on the phenyl moiety. The alkylene moiety can be linear or branched in nature and has from 1 to 3 carbon atoms (such as methylene, ethylene, n-propylene or isopropylene). Preferably, the alkylene moiety of $R_{10}$ has 1 or 2 carbon atoms and more preferably, it is methylene. The alkylene moiety can have as many substituents as there are available hydrogen atoms to be removed from a carbon atom. Useful alkylene substituents are the same as those described below in defining the phenyl substituents, but the most preferred substituents for the alkylene moiety are fluoro and alkoxy The phenyl moiety of $R_{10}$ can have from 1 to 5 substituents in any useful substitution pattern. Useful substituents include but are not limited to, halo groups (such as fluoro, chloro, bromo, and iodo), substituted or unsubstituted alkyl groups having from 1 to 12 carbon atoms (such as methyl, ethyl, isopropyl, t-butyl, n-pentyl and n-propyl) that can be further substituted with any of the substituents listed herein (such as haloalkyl groups including trihalomethyl groups), substituted or unsubstituted alkoxy groups having 1 to 12 carbon atoms (such as methoxy, ethoxy, isopropoxy, n-pentoxy and n-propoxy), cyano, nitro, substituted or unsubstituted aryl groups having 6 to 14 carbon atoms in the aromatic carbocyclic ring (as defined above for $R_7$, $R_8$ and $R_9$), substituted or unsubstituted alkyleneoxycarbonyl groups having 2 to 12 carbon atoms (such as methyleneoxycarbonyl, ethyleneoxycarbonyl and i-propyleneoxycarbonyl), substituted or unsubstituted alkylcarbonyloxy groups having 2 to 12 carbon atoms (such as methylenecarbonyloxy, ethylenecarbonyloxy and isopropylenecarbonyloxy), substituted or unsubstituted alkylcarbonyl groups having 2 to 12 carbon atoms (such as methylenecarbonyl, ethylenecarbonyl and isopropylenecarbonyl), amido groups, aminocarbonyl groups, trihalomethyl groups, perfluoroalkyl groups, formyl, mercapto and substituted or unsubstituted heterocyclic groups having 5 to 14 atoms in the ring that includes one or more nitrogen, sulfur, oxygen or selenium atoms with the remainder being carbon atoms (such as pyridyl, oxazolyl, thiphenyl, imidazolyl, and piperidinyl).

Preferably, $R_{10}$ contains 1 to 5 substituents (more preferably 1 or 2 substituents) on the phenyl moiety, which substituents are either halo groups, substituted or unsubstituted methyl or ethyl groups, or substituted or unsubstituted methoxy or 2-ethoxy groups. More preferably, $R_{10}$ comprises 1 to 3 methyl, fluoro, chloro, bromo or methoxy groups, or any combination of these groups on either the alkylene or phenyl moiety.

Representative preferred ionomers of Class IV include the following Polymers 28–36:

Polymer 28

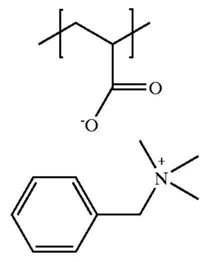

Polymer 29

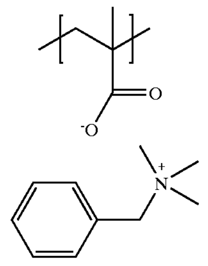

Polymer 30

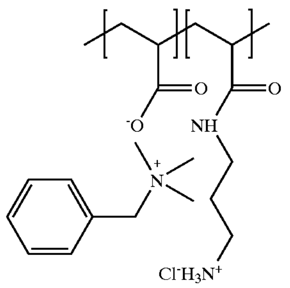

Polymer 31

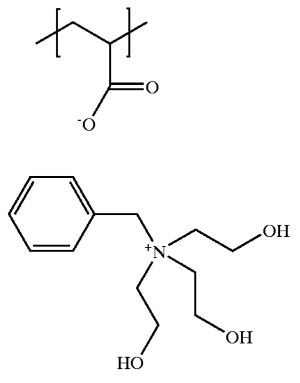

Polymer 32

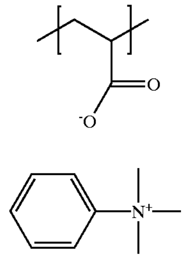

-continued

Polymer 33

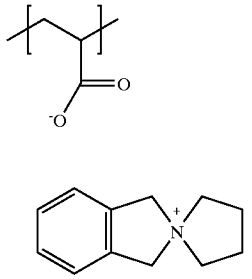

Polymer 34

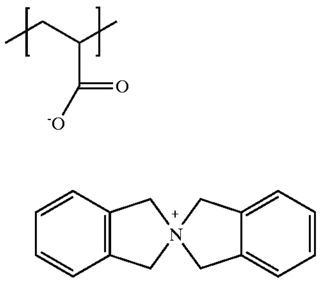

Polymer 35

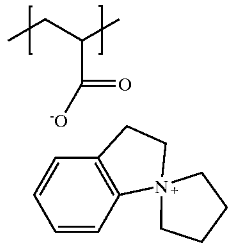

Polymer 36

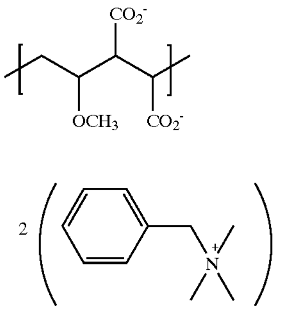

The polymers prepared as described below were characterized as having the ratio of moles of quaternary ammonium carboxylate groups to grams of polymer as shown in TABLE I below.

TABLE I

| Polymer | Ratio |
| --- | --- |
| 28 | 1:221 |
| 29 | 1:235 |
| 30 | 1:230 |
| 31 | 1:311 |
| 32 | 1:207 |
| 33 | 1:245 |
| 34 | 1:293 |
| 35 | 1:245 |
| 36 | 1:228 |

Polymers 28–36 can be prepared (in a solution) using the following procedures:

Preparation of Polymer 28 Solution

An aqueous solution [60.00 g of a 25% (w/w)] of polyacrylic acid (available from Polysciences, MW~90,000) was combined with 60.0 g distilled water and 84.63 g of a 41.5% (w/w) methanolic solution of benzyltrimethylammonium hydroxide (Aldrich Chemical). A gummy precipitate initially formed and was slowly redissolved over 30 minutes. The resulting polymer was stored as a 32% (w/w) solution in a water/methanol mixture.

Preparation of Polymer 29 Solution

A sample (3.00 g) of polymethacrylic acid (available from Polysciences, MW~30,000) was combined with 23.00 g of distilled water and 14.04 of a 41.5% (w/w) methanolic solution of benzyltrimethylammonium hydroxide (Aldrich Chemical). A gummy precipitate initially formed and was slowly redissolved over 30 minutes. The resulting polymer was stored as a 21% (w/w) solution in a water/methanol mixture.

Preparation of Polymer 30 Solution

A] A nitrogen-degassed solution of acrylic acid (1.00 g) and 3-aminopropylmethacrylamide hydrochloride (0.13 g) in water (10 ml) were added gradually over one hour using syringe pump to a rapidly stirring, nitrogen degassed solution of 2,2'-azobis(2-methylpropionamidine) dihydrochloride (0.056 g) in water (20 ml) at 60° C. The reaction solution was allowed to stir at 60° C. for an additional one hour and was then precipitated into acetonitrile. The solids were collected by vacuum filtration and dried in a vacuum oven at 60° C. overnight to afford 0.85 g of the product copolymer as a white powder.

B] A methanolic solution [4.7 ml of a 40% (w/w)] of benzylltrimethylammonium hydroxide (Aldrich Chemical) was added to a solution of the copolymer from step A (0.85 g) in 8.5 ml of distilled water. A gummy precipitate initially formed and was slowly redissolved over 30 minutes. The solution was diluted with water to a total volume of 23 ml (9.2% solids).

Preparation of Polymer 31 Solution

A] Benzyl tris(hydroxyethyl) ammonium bromide (26.78 g, synthesized by the procedure of Rengan et al. (*J. Chem. Soc. Chem. Commun.,* 10, 1992, 757) was dissolved in 250 ml of methanol and 5 ml water in a 500 ml round bottomed flask. Silver (I) oxide (20.56 g) was added and the mixture was stirred at room temperature for 72 hours. The insolubles were filtered off and the filtrates were concentrated to 80 ml by rotary evaporation. The clear solution was passed through a flash chromatography column packed with 300 $cm^3$ DOWEX® 550A OH resin using methanol eluent and concentrated to ~50 ml by rotary evaporation. The concentration of hydroxide anion in the solution was determined to be 1.353 meq/g by HCl titration.

B] A 25% (w/w) aqueous solution (12 g) of polyacrylic acid (available from Polysciences, MW~90,000) was combined with 13.30 g of methanol and 30.75 g of the solution from step A. The resulting polymer was stored as a 25% (w/w) solution in a water/methanol mixture.

Preparation of Polymer 32 Solution

An aqueous solution [8.00 g of a 25% (w/w)] of polyacrylic acid (Polysciences, MW~90,000) was combined with 10.00 g methanol and 12.31 g of a 2.254 meq/g (38.5% w/w) methanolic solution of phenyltrimethylammonium hydroxide (available from TCI America). A gummy precipitate initially formed and was slowly redissolved over 30 minutes. The resulting polymer was stored as a 21% (w/w) solution in a water/methanol mixture.

Preparation of Polymer 33 Solution

A] Pyrrolidine (48.93 g, Aldrich Chemical) was added using an addition funnel over 30 minutes to a solution of α,α'-dibromo-o-xylene (45.40 g, Aldrich Chemical) in diethyl ether (408 g). A white precipitate formed almost immediately. The solvent was decanted from the precipitated solid and the crude product was recrystallized from isopropanol, washed three times with diethyl ether, and dried overnight in a vacuum oven at 60° C. to afford a very hygroscopic powder. The purified product was stored as a solution in methanol of 25.4% solids.

B] The product solution of step A was combined in a 500 ml round bottomed flask with 9:1 methanol:water (130 ml) and silver (I) oxide (16.59 g). The flask grew slightly warm and the silver (I) oxide turned from black to a dull gray. The reaction solution was allowed to stir for an hour at room temperature and the insolubles were filtered off. The filtrates were passed through a flash chromatography column packed with 300 $cm^3$ of DOWEX® 550A OH resin using a methanol eluent. The collected fractions were concentrated to a weight of 36 g by rotary evaporation. The concentration of hydroxide anion was determined to be 2.218 meq/g by HCl titration.

C] An aqueous solution [12.00 g of a 25% (w/w)] of polyacrylic acid (Polysciences, MW~90,000) was combined with 11.44 g of methanol and 18.77 g of the solution from step B. A gummy precipitate initially formed and was slowly redissolved over 30 minutes. The resulting polymer was stored as an 18% (w/w) solution in a water/methanol mixture.

Preparation of Polymer 34 Solution

A] Anhydrous ammonia (Aldrich) was bubbled through a rapidly stirring suspension of α,α'-dibromo-o-xylene (26.36 g, Aldrich Chemical) in absolute ethanol (300 ml) for 2.5 hours. The reaction mixture was placed in a freezer for 2 hours and then filtered. The collected white solids were washed once with isopropanol and once with diethyl ether to afford 7.95 g of the quaternary ammonium bromide product as fine, white crystals.

B] A sample (7.39 g) of the product from step A was converted from the bromide to the hydroxide using 5.65 g silver (I) oxide and 70 ml of a 9:1 methanol:water mixture in an analogous manner as used for Polymer 6 (Step B). A solution (14.50 g) of 1.452 meq/g of hydroxide anion was obtained.

C] An aqueous solution [5.02 g of a 25% (w/w)] of polyacrylic acid (Polysciences, MW~90,000) was combined with 14.14 g of methanol and 12.00 g of the solution from step B. A gummy precipitate initially formed and was slowly redissolved over 30 minutes. The resulting polymer was stored as a 16% (w/w) solution in a water/methanol mixture.

Preparation of Polymer 35 Solution

A] Indoline (Aldrich, 14.06 g), 1,4-bromobutane (Aldrich, 25.48 g) and ammonium hydroxide (28% aqueous solution, Aldrich, 45.0 g) were combined in a 500 ml round bottomed flask fitted with an addition funnel and a condenser. The reaction mixture was heated to reflux and 23.0 g of additional ammonium hydroxide solution were added dropwise over 30 minutes. The reaction solution was heated at reflux overnight and the liquids were evaporated from the crude product using a rotary evaporator. The remaining brown solids were dissolved in hot isopropanol and filtered hot to remove residual ammonium bromide. The filtrates were concentrated to an orange colored oil, dissolved in 200 ml methanol, adsorbed onto about 100 $cm^3$ silica gel, and loaded onto the top of a flash chromatography column packed with about 1000 $cm^3$ of silica gel. The column was first eluted with 1:1 ethyl acetate:hexane to remove an organic-soluble impurity, and then with methanol to elute the desired product. The collected methanolic solution was concentrated to a yellow colored oil on a rotary evaporator to provide 15.0 g of the purified spiro-indolinium bromide salt.

B] All of the purified product from Step A was dissolved in 150 ml of a 9:1 methanol:water mixture. It was then converted to the corresponding hydroxide salt with silver (I) oxide (27.34 g) in an analogous manner as used for Polymer 6 (Step B). A solution (41.9 g) of 1.300 meq/g of hydroxide anion was obtained.

C] A 25% (w/w) aqueous solution (5 g) of polyacrylic acid (Polysciences, MW~90,000) was combined with 13.34 g of the solution from step B. A gummy precipitate initially formed and was slowly redissolved over 30 minutes. The resulting polymer was stored as a 23.28% (w/w) solution in a water/methanol mixture.

Preparation of Polymer 36 Solution

GANTREZ® AN-139 polymer (ISP Technologies, 1.00 g) was added to a solution comprising distilled water (10 g) and 5.36 g of a 40% (w/w) aqueous solution of benzyltrimethylammonium hydroxide (Aldrich Chemical). The resulting mixture was stirred vigorously for 12 hours at which point a clear, homogeneous solution of 17.80% (w/w) had formed.

Additional preferred ionomers of Class IV include the following Polymers 37–50 wherein $R_{10}$ includes a substituted alkylenephenyl group:

Polymer 37

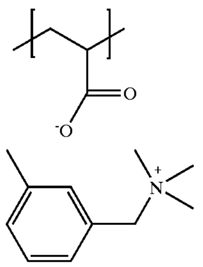

Polymer 38

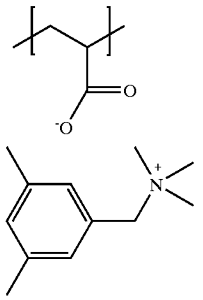

Polymer 39

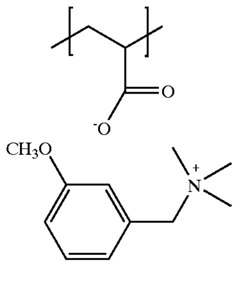

-continued

Polymer 40

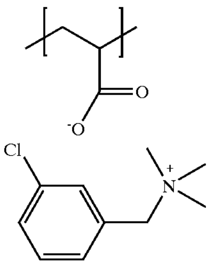

Polymer 41

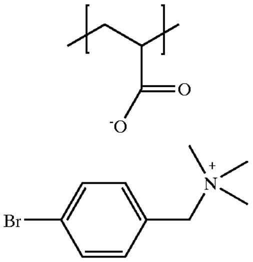

Polymer 42

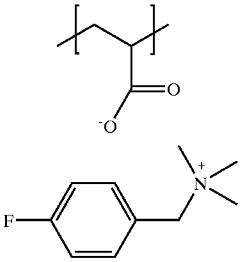

Polymer 43

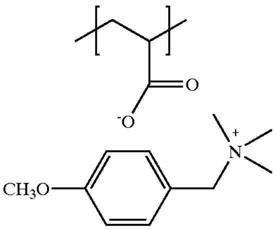

Polymer 44

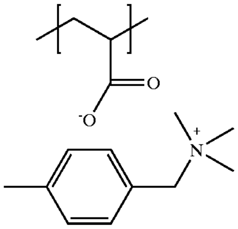

Polymer 45

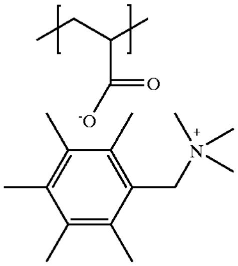

-continued

Polymer 46

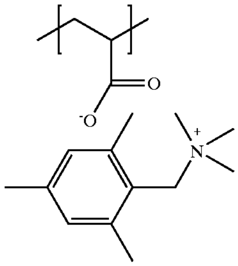

Polymer 47

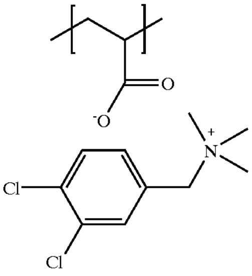

Polymer 48

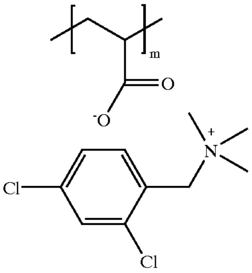

Polymer 49

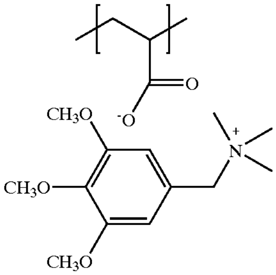

Polymer 50

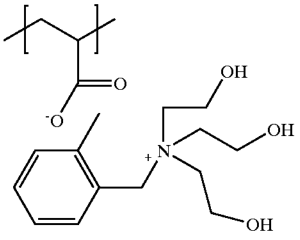

These preferred Class IV ionomers (as solutions) can be prepared using the following procedures:

Preparation of Solutions of Polymers 37–49:

Polymers 37–49 were all synthesized using a basic three-step process. The first step involved the reaction of the substituted benzyl halides with 1.5 to 3.0 equivalents of trimethylamine in ether to yield substituted benzyltrimethylammonium halide salts. These salts were characterized by proton NMR and electrospray-MS and the purity was further checked by reverse phase HPLC.

The second step involved the conversion of the halide salts to the corresponding hydroxides using 1.0 equivalents of $Ag_2O$ in methanol-water followed by the removal of volatiles to afford solutions with a hydroxide content of 0.5 to 2.5 meq/g as determined by HCl titration. The hydroxide salts were characterized by electrospray-MS and the purity was checked by reverse phase HPLC.

The third step was the neutralization of polyacrylic acid (MW=90,000) with the various substituted benzyltrimethylammonium hydroxides to yield solutions (usually 20% w/w) of the polymers in MeOH/water (having weight ratios ranging from 2:1 to 1:2). A representative procedure is described below for making Polymer 37.

Preparation of Polymer 37 Solution

A] 3-Methylbenzyl bromide (24.64 g, $1.33\times10^{-1}$ mol, Aldrich) was dissolved in 221 g of diethyl ether in a 500 ml round bottomed flask. A 33% (w/w) solution of trimethylamine in methanol (35.80 g, $2.00\times10^{-1}$ mol, Acros) was added all at once, forming a white precipitate almost immediately. The reaction mixture was allowed to stir overnight at room temperature and was then filtered and washed three times with diethyl ether. The resulting white powder was dried in a vacuum oven overnight to afford 29.38 g (90% yield) of 3-methylbenzyl trimethylammonium bromide.

B] The bromide salt from step A (10 g) was dissolved in 100 ml of 9:1 methanol/water in a 250 ml round bottomed flask. Silver (I) oxide (9.5 g, $4.10\times10^{-1}$ mol, Aldrich) was added all at once and stirred for two hours at which point the silver oxide had changed color from a dark black to a dull gray. The solids were then filtered off, first using standard filter paper, then using a 0.5 μm Millipore FC membrane filter. The filtrates were concentrated to a volume of ~40 ml on a rotary evaporator. The concentration of hydroxide anion in the solution was determined to be 1.237 meq/g by HCl titration.

C] A 25% (w/w) aqueous solution (6.04 g) of polyacrylic acid (Polysciences, MW~90,000) was combined with 1.79 g methanol and 17.17 g of the solution from step B. A gummy precipitate initially formed and slowly redissolved over a 30 minutes. The polymer was stored as a 20% (w/w) solution in methanol-water.

Polymers 38–49 were synthesized using analogous procedures. Variations from the representative procedure are noted where applicable in TABLE II below.

Preparation of Polymer 50 Solution (3 Steps)

A] 2-Methylbenzyl bromide (10.00 g, $5.40\times10^{-2}$ mol, Aldrich), triethanolamine (10.48 g, $7.02\times10^{-2}$ mol, Aldrich), and tetrahydrofuran (54 ml) were combined in a 200 ml round bottomed flask fitted with a reflux condenser and a nitrogen inlet. The reaction was stirred at reflux for 14 hours at which point a large amount of a white solid had formed. The solid was collected by vacuum filtration, recrystallized from ethanol, and dried overnight in a vacuum oven at 60° C. 10.67 g (59% yield) of a fine, white powder was collected.

B] 10.00 Grams ($2.99\times10^{-2}$ mol) of the product from step A was converted to the corresponding hydroxide salt using the procedure described for Polymer 37 (step B). 30 ml of a solution with a hydroxide content of 0.906 meq/g was obtained.

C] 3.38 Grams of a 25% (w/w) aqueous solution of polyacrylic acid (available from Polysciences, MW~90,000) was combined with 1.60 g of methanol and 15.02 g of the solution from step A. The resulting polymer was stored as a 20% (w/w) solution in a water/methanol mixture.

TABLE II

| Polymer # | Substituted Benzyl halide | Step A Conditions | Step A yield | [$^-$OH] (meq/g) of ammonium hydroxide solution (Step 13) |
|---|---|---|---|---|
| 37 | 3-methylbenzyl bromide | Ether, 25° C., 20 hours | 90% | 1.237 |
| 38 | 3,5-dimethyl-benzyl bromide | Ether, 25° C., 20 hours | 97% | 1.145 |
| 39 | 1-bromomethyl-3-methoxybenzene | Ether, 25° C., 20 hours | 98% | 1.204 |
| 40 | 3-chlorobenzyl bromide | Ether, 25° C., 20 hours | 98% | 1.256 |
| 41 | 4-bromobenzyl bromide | Ether, 25° C., 20 hours | 99% | 1.330 |
| 42 | 4-fluorobenzyl bromide | Ether, 25° C., 20 hours | 97% | 0.952 |
| 43 | 4-methoxybenzyl chloride | Ether, 25° C., 20 hours | 84% | 2.220 |
| 44 | 4-methylbenzyl bromide | Ether, 25° C., 20 hours | 98% | 1.372 |
| 45 | pentamethyl-benzyl chloride | Ether, 3 eq. $NMe_3$, reflux, 20 hours | 98% | 1.100 |
| 46 | α-chloro-isodurene | Ether, 3 eq. $NMe_3$, 20 hours at 25° C. then reflux for 4 hours | 83% | 1.520 |
| 47 | 3,4-dichloro-benzyl chloride | Ether, 3 eq. $NMe_3$, reflux for 24 hours | 54% | 1.09 |
| 48 | 2,4-dichloro-benzyl chloride | Ether, 3 eq. $NMe_3$, reflux, 20 hours | 61% | 1.14 |
| 49 | 3,4,5-trimethoxy-benzyl bromide* | Ether, 25° C., 20 hours | 88% | 0.516 |

*3,4,5-Trimethoxybenzyl bromide was synthesized from 3,4,5-trimethoxybenzyl alcohol using triphenylphosphine/$CBr_4$.

The imaging layer of the imaging member can include one or more Class I, II, III, or IV ionomers with or without minor amounts (less than 20 weight %, based on total dry weight of the layer) of additional binder or polymeric materials that will not adversely affect its imaging properties.

In the heat-sensitive composition of this invention used to provide the heat-sensitive layer, the amount of ionomer is generally present in an amount of at least 1% solids, and preferably at least 2% solids. A practical upper limit of the amount of ionomer in the composition is about 10% solids.

The amount of ionomer(s) used in the imaging layer is generally at least 0.1 g/m$^2$, and preferably from about 0.1 to about 10 g/m$^2$ (dry weight). This generally provides an average dry thickness of from about 0.1 to about 10 μm.

The imaging layer can also include one or more conventional surfactants for coatability or other properties, dyes or colorants to allow visualization of the written image, or any other addenda commonly used in the lithographic art, as long as the concentrations are low enough so they are inert with respect to imaging or printing properties.

It is essential that the heat-sensitive composition and resulting heat-sensitive imaging layer includes one or more photothermal conversion materials to absorb appropriate radiation from an appropriate energy source (such as a laser), which radiation is converted into heat. Preferably, the radiation absorbed is in the infrared and near-infrared regions of the electromagnetic spectrum. The photothermal conversion materials useful in this invention are latex polymer-carbon black composite particles.

The term "latex polymer-carbon black composite particles" denotes pigmented particles comprising two distinct physical phases, a latex polymer phase and a carbon black phase. The latex polymer phase is generally formed in the presence of the carbon black particles in situ using an emulsion polymerization process. The phase domains are not separated apart from each other and there are bonds or interfaces between them.

In the preparation process, a portion of an addition polymerization initiator is added to an aqueous carbon black mixture before introducing a monomer mixture that is used to form the latex polymer phase of the particles around the carbon black. The aqueous carbon black mixture comprises carbon black particles on the order of from about 5 nm to about 5 μm in size that are used to form the carbon black phase of the composite particles. The carbon black phase and the polymer phase are essentially incompatible. However there may be an interface formed between the carbon black phase and polymer phase.

In a preferred embodiment of that process, the ethylenically-unsaturated polymerizable monomers that may be employed comprise:

a) one or more ethylenically unsaturated polymerizable monomers that are free of ionic charge groups and each monomer being capable of addition polymerization to form a substantially water-insoluble homopolymer, and b) one or more other ethylenically unsaturated polymerizable monomers, each monomer being capable of addition polymerization to form a substantially water-soluble homopolymer.

In accordance with the above-described process, the monomer mixture is added to the carbon black mixture continuously. The duration of the addition time depends on the types of monomers and reaction temperatures employed. The addition time can be shorter for more reactive monomers and at higher reaction temperatures. For monomers of low reactivity at a lower reaction temperature, a shorter monomer addition time may flood the system with free monomers that can form secondary polymer particles that comprise essentially no carbon black phase. With longer addition time, the polymerization is carried out under monomer starvation conditions and almost all the monomers are consumed by the carbon black particles.

In accordance with the above process, a preferred way to cause an addition polymerization initiator to form a free radical is by using heat. Depending on the types of initiators used, the reaction temperature can vary from about 30 to about 90° C. Preferably the reaction temperature is at least 40° C. and most preferably at least 50° C. To ensure that no free monomer is present, usually the reaction is continued for a longer time after the monomer addition. Also initiator may need to be added to scavenge remaining monomers during the final stage of the reaction to increase the reaction conversion.

The carbon black that may be used to prepare the latex polymer-carbon black composite particles include Monarch® 1400, Monarch® 1300, Monarch® 1100, Monarch® 1000, Monarch® 900, Monarch® 880, Monarch® 800, Monarch® 700, Cabojet200, Cabojet300, IJX55, and IJX76, all available from Cabot, Color Black FW 200, Color Black FW 2, Color Black FW 2V, Color Black FW 1, Color Black FW 18, Color Black S 160, Color Black S 170, Special Black 6, Special Black 5, Special Black 4A, Special Black 4, Printex U, Printex V, Printex 140U, and Printex 140V, all available from Degussa, and LHD9303 Black available from Sun Chemical.

Various processes known in the art can be used in the invention to form a suspension of carbon black particles in an aqueous medium. The suspensions are primarily composed of carbon black particles, dispersants/surfactants, and water. The dispersants can be nonionic, anionic, cationic, and/or polymeric and can be used at levels as high as 50% of the carbon black particles.

Carbon black particles useful in the invention can be formed by various methods known in the art. For example, they can be prepared by pulverizing and classifying dry pigments followed by redispersing the resultant particles in water using a dispersant. They can also be prepared by mechanically grinding a pigment material in water to a desired particle size in the presence a dispersant.

Addition polymerization initiators useful in the above-described process include, for examples, an azo and diazo compounds, such as 2,2'-azobisisobutyronitrile, 2,2'-azobis (2,4-dimethyl valeronitrile), 2,2'-azobis(2,3-dimethyl butyronitrile), 2,2'-azobis(2-methyl butyronitrile), 2,2'-azobis(2,3,3-trimethyl butyronitrile), 2,2'-azobis(2-isopropyl butyronitrile), 1,1'-azobis(cyclohexane-1-carbonitrile), 2,2'-azobis(4-methoxyl-2,4-dimethyl valeronitrile), 2-(carbamoylazo)isobutyronitrile, 4,4'-azobis (4-cyanovaleric acid), and dimethyl-2,2'azobis isobutyrate, or peroxide compounds, such as butyl peroxide, propyl peroxide, butyryl peroxide, benzoyl isobutyryl peroxide, and benzoyl peroxide, or water soluble initiators, for example, sodium persulfate, and potassium persulfate, or any redox initiators. The initiators may be used in an amount varying from about 0.2 to 3 or 4 weight percent or higher by weight of the total monomers. Usually, a higher initiator concentration results in lower molecular weights of the final polymers. In general, since carbon black is an inorganic pigment, good results can be obtained using a water-soluble initiator.

Surfactants that can be used in the above-described process include, for example, a sulfate, a sulfonate, a cationic compound, a reactive surfactant, an amphoteric compound, and a polymeric protective colloid. Specific examples are described in "McCutcheon's Emulsifiers and Detergents: 1995, North American Editor". A chain transfer agent such as butyl mercaptan may also be used to control the properties of the polymer formed.

The ethylenically-unsaturated monomers which can be used in the above-described process to make the latex polymer-carbon black composite particles include, for example, the following monomers and their mixtures: acrylic acid, methacrylic acid, ethacrylic acid, methyl acrylate, ethyl acrylate, ethyl methacrylate, benzyl acrylate, benzyl methacrylate, propyl acrylate, propyl methacrylate, iso-propyl acrylate, iso-propyl methacrylate, butyl acrylate, butyl methacrylate, hexyl acrylate, hexyl methacrylate, octadecyl methacrylate, octadecyl acrylate, lauryl methacrylate, lauryl acrylate, hydroxyethyl acrylate, hydroxyethyl methacrylate, hydroxyhexyl acrylate, hydroxyhexyl methacrylate, hydroxyoctadecyl acrylate, hydroxyoctadecyl methacrylate, hydroxylauryl methacrylate, hydroxylauryl acrylate, phenethylacrylate, phenethyl methacrylate, 6-phenylhexyl acrylate, 6-phenylhexyl methacrylate, phenyllauryl acrylate, phenyllaurylmethacrylate, 3-nitrophenyl-6-hexyl methacrylate, 3-nitrophenyl-18-octadecyl acrylate, ethyleneglycol dicyclopentyl ether acrylate, vinyl ethyl ketone, vinyl propyl ketone, vinyl hexyl ketone, vinyl octyl ketone, vinyl butyl ketone, cyclohexyl acrylate,3-methacryloxypropyl-dimethylmethoxysilane, 3-methacryloxypropyl-methyldimethoxysilane,3-methacryloxypropyl-pentamethyldisiloxane, 3-methacryloxypropyltris-(trimethylsiloxy)silane,3-acryloxypropyl-dimethylmethoxysilane, acryloxypropylmethyldimethoxysilane, trifluoromethyl styrene, trifluoromethyl acrylate, trifluoromethyl methacrylate, tetrafluoropropyl acrylate, tetrafluoropropyl methacrylate, heptafluorobutyl methacrylate, isobutyl acrylate, isobutyl methacrylate, 2-ethylhexyl acrylate, 2-ethylhexyl methacrylate, isooctyl acrylate, isooctyl methacrylate, N,N-dihexyl acrylamide, N,N-dioctyl acrylamide, N,N-dimethylaminoethyl acrylate, N,N-dimethylaminoethyl methacrylate, N,N-diethylaminoethyl acrylate, N,N-diethylaminoethyl methacrylate, piperidino-N-ethyl acrylate, vinyl propionate, vinyl acetate, vinyl butyrate, vinyl butyl ether, and vinyl propyl ether ethylene, styrene, vinyl carbazole, vinyl naphthalene, vinyl anthracene, vinyl pyrene, methyl methacrylate, methyl acrylate, alpha-methylstyrene, dimethylstyrene, methylstyrene, vinylbiphenyl, glycidyl acrylate, glycidyl methacrylate, glycidyl propylene, 2-methyl-2-vinyl oxirane, vinyl pyridine, aminoethyl methacrylate, aminoethylphenyl acrylate, maleimide, N-phenyl maleimide, N-hexyl maleimide, N-vinyl-phthalimide, and N-vinyl maleimide poly(ethylene glycol) methyl ether acrylate, polyvinyl alcohol, vinyl pyrrolidone, vinyl 4-methylpyrrolidone, vinyl 4-phenylpyrrolidone, vinyl imidazole, vinyl 4-methylimidazole, vinyl 4-phenylimidazole, acrylamide, methacrylamide, N,N-dimethyl acrylamide, N-methyl acrylamide, N-methyl methacrylamide, aryloxy dimethyl acrylamide, N-methyl acrylamide, N-methyl methacrylamide, aryloxy piperidine, and N,N-dimethyl acrylamide acrylic acid, methacrylic acid, chloromethacrylic acid, maleic acid, allylamine, N,N-diethylallylamine, vinyl sulfonamide, sodium acrylate, sodium methacrylate, ammonium acrylate, ammonium methacrylate, acrylamidopropanetriethylammonium chloride, methacrylamidopropanetriethylammonium chloride, vinyl-pyridine hydrochloride, sodium vinyl phosphonate and sodium 1-methylvinylphosphonate, sodium vinyl sulfonate, sodium 1-methylvinyl-sulfonate, sodium styrenesulfonate, sodium acrylamidopropanesulfonate, sodium methacrylamidopropanesulfonate, and sodium vinyl morpholine sulfonate, allyl methacrylate, allyl acrylate, butenyl acrylate, undecenyl acrylate, undecenyl methacrylate, vinyl acrylate, and vinyl methacrylate; dienes such as butadiene and isoprene; esters of saturated glycols or diols with unsaturated monocarboxylic acids, such as, ethylene glycol diacrylate, ethylene glycol dimethacrylate, triethylene glycol dimethacrylate, 1,4-butanediol dimethacrylate, 1,3-butanediol dimethacrylate, pentaerythritol tetraacrylate, trimethylol propane trimethacrylate, and polyfunctional aromatic compounds such as divinylbenzene.

The latex polymer-carbon black composite particles are generally present in the heat-sensitive composition and resulting heat-sensitive imaging layer in an amount sufficient to provide an optical transmission density of at least 0.1, and preferably at least 0.4, at the operating wavelength of the imaging laser (for example, 830 nm). The particular amount needed for this purpose would be readily apparent to one skilled in the art, depending upon the specific material used. For example, the net amount of carbon present in the heat-sensitive coating compositions of this invention in an amount of at least 0.1 weight %, preferably at least 0.25 weight %, and generally up to 5 weight %.

Latex polymer-carbon black composite particle size can also vary. Preferred latex polymer-carbon black composite particles are greater than 5 nm and less than 1 $\mu$m. Particularly preferred particles are less than 0.1 $\mu$m.

The heat-sensitive compositions of this invention and resulting heat-sensitive imaging layers can include additional photothermal conversion materials, although the presence of such materials is not preferred. Such optional materials can be dyes, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{29}$ component, are also useful. Useful absorbing dyes for near infrared diode laser beams are described, for example, in U.S. Pat. No. 4,973,572 (DeBoer). Particular dyes of interest are "broad band" dyes, that is those that absorb over a wide band of the spectrum.

Alternatively, the same or different photothermal conversion material (including latex polymer-carbon black composite particles) can be included in a separate layer that is in thermal contact with the heat-sensitive imaging layer. Thus, during imaging, the action of the additional photothermal conversion material can be transferred to the heat-sensitive imaging layer.

The heat-sensitive composition of this invention can be applied to a support using any suitable equipment and procedure, such as spin coating, knife coating, gravure coating, dip coating or extrusion hopper coating. In addition, the composition can be sprayed onto a support, including a cylindrical support, using any suitable spraying means for example as described in U.S. Pat. No. 5,713,287 (noted above).

The heat-sensitive compositions of this invention are generally formulated in and coated from water or water-miscible solvents including, but not limited to, water-miscible alcohols (for example, methanol, ethanol, isopropanol, 1-methoxy-2-propanol, and n-propanol), methyl ethyl ketone, tetrahydrofuran, acetonitrile, N,N-dimethylformamide, butyrolactone, and acetone. Water, methanol, ethanol, and 1-methoxy-2-propanol are preferred. Mixtures (such as a mixture of water and methanol) of these solvents can also be used if desired. By "water-miscible" is meant that the solvent is soluble in water at all proportions at room temperature.

While the heat-sensitive compositions of this invention are preferably used in the lithographic printing plates described herein, they can be used for various other situations where a heat-sensitive composition may be useful to provide images. Thus, the heat-sensitive compositions are not intentionally limited to what are known as "computer-to-press" or "ready-to-write or printing plates.

In preferred embodiments, the imaging members of this invention can be of any useful form including, but not limited to, printing plates, printing cylinders, printing sleeves and printing tapes (including flexible printing webs), all of any suitable size or dimensions. Preferably, the imaging members are printing plates or on-press cylinders.

During use of preferred embodiments, the imaging member of this invention is exposed to a suitable source of energy that generates or provides heat, such as a focused laser beam, in an imagewise fashion in the foreground areas where ink is desired in the printed image, typically from digital information supplied to the imaging device. A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al.), incorporated herein by reference with respect to such imaging devices. The imaging member is typically sensitized so as to maximize responsiveness at the emitting wavelength of the laser.

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between an imaging device (such as laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the beam can be moved parallel to the drum axis and, after each pass across the imaging member, increment angularly so that the image "grows" circumferentially. In both cases, after a complete scan by the laser beam, an image corresponding to the original document or picture can be applied to the surface of the imaging member.

In the flatbed configuration, a laser beam is drawn across either axis of the imaging member, and is indexed along the other axis after each pass. Obviously, the requisite relative motion can be produced by moving the imaging member rather than the laser beam.

While laser imaging is preferred in the practice of this invention, imaging can be provided by any other means that provides or generates thermal energy in an imagewise fashion. For example, imaging can be accomplished using a thermoresistive head (thermal printing head) in what is known as "thermal printing", described for example in U.S. Pat. No. 5,488,025 (Martin et al.). Such thermal printing heads are commercially available (for example, as Fujitsu Thermal Head FTP-040 MCS001 and TDK Thermal Head F415 HH7-1089).

Imaging of heat-sensitive compositions on printing press cylinders can be accomplished using any suitable means, for example, as taught in U.S. Pat. No. 5,713,287 (noted above).

After imaging, the imaging member can be used for printing without conventional wet processing. Applied ink can be imagewise transferred to a suitable receiving material (such as cloth, paper, metal, glass or plastic) to provide one or more desired impressions. If desired, an intermediate blanket roller can be used to transfer the ink from the imaging member to the receiving material. The imaging members can be cleaned between impressions, if desired, using conventional cleaning means.

The following examples illustrate the practice of the invention, and are not meant to limit it in any way. The synthetic methods are presented to show how some of the latex polymer-carbon black composite particles can be prepared. The various latex polymer-carbon black composite particles used in the present invention are shown in TABLE III and identified as "carbon". "Carbon" 6 was a control carbon black material containing no polymers.

TABLE III

| | Polymer Composition (weight ratio) | Polymer/carbon black (weight) ratio |
|---|---|---|
| "Carbon" 1 | MMA/MAA/DVB (75/20/5) | 1/1 |
| "Carbon" 2 | MMA/MAA/DVB (90/5/5) | 0.5/1 |
| "Carbon" 3 | S/BMA/MAA (25/60/15) | 1/1 |
| "Carbon" 4 | MMA/VP (80/20) | 0.5/1 |
| "Carbon" 5 | MMA/VP (80/20) | 1/1 |
| "Carbon" 6 | None (Control) | — |

MMA is methyl methacrylate
VP is N-vinyl pyrrolidone
MAA is methacrylic acid
BMA is butyl methacrylate
DVB is divinyl benzene
S is styrene Preparation of "Carbon" 1 Composition Particles The following components were mixed for mill grind:

| | |
|---|---|
| Polymeric beads (mean diameter of 50 μm, milling media) | 325.0 g |
| Black Pearls 880 (Cabot Chemical Company) | 30 g |
| Oleoyl methyl taurine (OMT sodium salt) | 10.5 g |
| Deionized water | 209.5 g |
| Proxel GXL ® (biocide from Zeneca) | 0.2 g |

These components were milled in a 2-liter double-walled vessel obtained from BYK-Gardner using a high-energy media mill manufactured by Morehouse-Cowles Hochmeyer. The mill was run for approximately 8 hours at room temperature. The dispersion was separated from the milling media by filtering the millgrind through a 4–8 μm KIMAX® Buchner Funnel obtained from VWR Scientific Products.

A stirred reactor containing 60 g of the carbon black dispersion noted above was heated to 85° C. and purged with $N_2$ for 2 hours. Sodium persulfate initiator (0.015 g) in 1 g of water was then added to the reactor. An emulsion containing 30 g of deionized water, 0.25 g of sodium dodecyl sulfonate surfactant, 0.015 g of initiator, 2.25 g of methyl methacrylate, 0.6 g of methacrylic acid, and 0.15 g of divinyl benzene was added continuously for 2 hours. The reaction was allowed to continue for 4 more hours before the reactor was cooled down to room temperature. The composite carbon black particles dispersed in water (composite carbon black particle dispersion) were then filtered through glass fibers to remove any coagulum. The resulting particles contained about 50% by weight of the carbon black phase and about 50% by weight of the polymer phase.

Preparation of "Carbons" 2–5

"Carbons" 2–4 were prepared in a similar manner to "Carbon" 1 except that "Carbons" 2–4 contained different latex polymers having the compositions and latex polymer to carbon black ratios as listed in TABLE III above. "Carbon" 5 was prepared using the non-ionically stabilized carbon black dispersion FX-GEW-42 that was obtained from Nippon Shokubai Co. The polymer composition is shown in Table III above.

EXAMPLES 1–4

Imaging Members Containing Thiosulfate Ionomers

Imaging formulations 1–4 were prepared using the components (parts by weight) shown in TABLE IV below:

TABLE IV

| Component | Formulation 1 Example 1 | Formulation 2 Example 2 | Formulation 3 Example 3 | Formulation 4 Example 4 |
|---|---|---|---|---|
| Polymer 20 | 0.33 | 0.33 | 0.33 | 0.33 |
| "Carbon" 1 | 0.84 | — | — | — |
| "Carbon" 2 | — | 0.85 | — | — |
| "Carbon" 3 | — | — | 1.00 | — |
| "Carbon" 4 | — | — | — | 0.73 |
| Water | 6.03 | 6.02 | 5.87 | 7.94 |
| Methanol | 1.80 | 1.80 | 1.80 | — |

Each formulation was coated at a dry coating weight of about 1.0 g/m$^2$ onto a grained phosphoric acid-anodized aluminum support. The resulting printing plates were air-dried. Each printing plate was imaged at 830 nm on a platesetter (similar to the commercially available CREO TRENDSETTER™, but smaller in size) having an array of laser diodes operating at a wavelength of 830 nm each focused to a spot diameter of 23 $\mu$m. Each channel provided a maximum of 356 mW of power incident on the recording surface. The printing plates were mounted on a drum whose rotation speed was varied to provide for a series of doses ranging from 364 to 820 mJ/cm$^2$. The laser beams were modulated to produce halftone dot images.

Each imaged printing plate was mounted on the plate cylinder of a commercially available full-page printing press (A. B. Dick 9870 duplicator) for a press run. A commercial black ink and Varn Universal Pink fountain solution (Vam Products Co.) were used. All printing plates were developed on press within the first 60 seconds of the press run and printed with full density and high image quality for at least 1,000 impressions.

EXAMPLES 5–7

Imaging Members Containing Poly (benzyltrimethyl-ammonium acrylate)Ionomers

Imaging formulations 5–8 were prepared using the components (parts by weight) shown in TABLE V below:

TABLE V

| Component | Formulation 5 Example 5 | Formulation 6 Example 6 | Formulation 7 Example 7 | Formulation 8 Control |
|---|---|---|---|---|
| Polymer 28 Solution | 5.646 | 5.646 | 5.646 | 5.646 |
| "Carbon" 1 | 2.133 | — | — | — |
| "Carbon" 2 | — | 2.186 | — | — |
| "Carbon" 4 | — | — | 2.506 | — |
| "Carbon" 6* | — | — | — | 1.412 |
| Water | 12.661 | 12.622 | 12.382 | 13.202 |
| Methanol | 4.220 | 4.207 | 4.127 | 4.401 |

TABLE V-continued

| Component | Formulation 5 Example 5 | Formulation 6 Example 6 | Formulation 7 Example 7 | Formulation 8 Control |
|---|---|---|---|---|
| Surfactant solution** | 0.226 | 0.226 | 0.226 | 0.226 |
| Epoxy resin# | 0.113 | 0.113 | 0.113 | 0.113 |

*Carbon 6: surfactant-stabilized carbon black from Example 1 used as control
**FLUORAD FC-135 (3M Corp.), 5% (w/w) in 2:1 IPA:water
#CR-5L (Esprit Chemicals)
The Polymer 28 Solution was prepared as described above.

Each formulation was coated at a dry coating weight of about 1.0 g/m$^2$ onto a grained phosphoric acid-anodized aluminum support. The resulting printing plates were dried and cured in an oven at 80° C. for 10 minutes. Each printing plate was imaged at 830 nm on a platesetter as described in Examples 1–4 at a series of images set at various exposures (1200, 900, 720, and 600 mJ/cm$^2$ respectively). Each imaged printing plate was then mounted on an A. B. Dick 9870 duplicator for a press run.

The three formulations that included the latex polymer-carbon black composite particles (Formulations 5, 6, and 7) all yielded coatings with darker color than the Control formulation (Formulation 8). In addition, macroscopic flocculation was evident to the naked eye in Formulation 8. When run on press, Formulations 5–7 rolled up to a satisfactory ink density on the three highest exposures. Formulation 8, in comparison, rolled up very slowly to produce medium gray images.

EXAMPLE 8

Imaging Member Containing Poly (Vinylbenzyltrimethyl-ammonium chloride)Ionomer A 9:1 (mol ratio) copolymer of vinylbenzyltrimethylammonium chloride (mixture of m, p isomers) and N-(3-aminopropyl)methacrylamide hydrochloride] (Polymer 14) was prepared via the procedure described in U.S. Pat. No. 6,190,830 (noted above).

A coating formulation was prepared using the above cationic copolymer (0.600 g), Carbon 5 (1.285 g), water (10.773 g), methanol (10.773 g), and bis (vinylsulfonylmethane) crosslinker (1.569 g of a 4.71% w/w aqueous solution). The formulation (hereafter referred to as Formulation 8) was coated, imaged, and run on press in the same manner as described in Example 1–4 except that a slightly lower imaging power series was used (900, 600, 450, and 350 mJ/cm$^2$). The coatings were dark black in color and free of flocculation. When run on press, the formulation rolled up to a satisfactory ink density at all of the exposures within 25 impressions and printed with excellent ink density and print quality for the entire run of 1000 impressions.

The invention has been described in detail with particular reference to preferred embodiments thereof, but it will be understood that variations and modifications can be effected within the spirit and scope of the invention.

We claim:

1. A heat-sensitive composition comprising:

a) a hydrophilic heat-sensitive ionomer, and b) latex polymer-carbon black composite particles.

2. The composition of claim 1 further comprising water, a water-miscible solvent, or a mixture of two or more of these.

3. The composition of claim 1 wherein the heat-sensitive ionomer is selected from the following four classes of polymers:

I) a crosslinked or uncrosslinked vinyl polymer comprising recurring units comprising positively-charged, pendant N-alkylated aromatic heterocyclic groups, II) a crosslinked or uncrosslinked polymer comprising recurring organoonium groups, III) a polymer comprising a pendant thiosulfate group, and IV) a polymer comprising recurring units comprising carboxy or carboxylate groups.

4. The composition of claim 3 wherein said heat-sensitive ionomer is a Class I polymer represented by the Structure I:

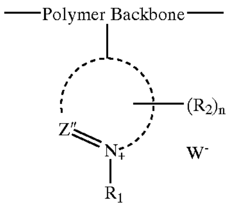

I wherein $R_1$ is an alkyl group, $R_2$ is an alkyl group, an alkoxy group, an aryl group, an alkenyl group, halo, a cycloalkyl group, or a heterocyclic group having 5 to 8 atoms in the ring, Z" represents the carbon and nitrogen, oxygen, or sulfur atoms necessary to complete an aromatic N-heterocyclic ring having 5 to 10 atoms in the ring, n is 0 to 6, and $W^-$ is an anion.

5. The composition of claim 4 wherein $R_1$ is an alkyl group of 1 to 6 carbon atoms, $R_2$ is a methyl, ethyl or n-propyl group, Z" represents the carbon, nitrogen, oxygen, and sulfur atoms to complete a 5-membered ring, and n is 0 or 1.

6. The composition of claim 3 wherein said heat-sensitive ionomer is a Class I polymer represented by the Structure II:

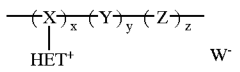

II wherein $HET^+$ represents a positively-charged, pendant N-alkylated aromatic heterocyclic group, X represents recurring units having attached $HET^+$ groups, Y represents recurring units derived from ethylenically unsaturated polymerizable monomers that provide active crosslinking sites, Z represents recurring units for additional ethylenically unsaturated monomers, x is from about 15 to 100 mol %, y is from 0 to about 20 mol %, z is from 0 to about 85 mol %, and $W^-$ is an anion.

7. The composition of claim 6 wherein x is from about 20 to about 98 mol %, y is from about 2 to about 10 mol %, z is from 0 to about 73 mol %.

8. The composition of claim 6 wherein said positively-charged, pendant N-alkylated aromatic heterocyclic group is an imidazolium or pyridinium group.

9. The composition of claim 3 wherein said heat-sensitive ionomer is a Class II polymer that is a polyester, polyamide, polyamide-ester, polyarylene oxide or a derivative thereof, polyurethane, polyxylylene or a derivative thereof, a poly (phenylene sulfide) ionomer, or a silicon-based sol gel.

10. The composition of claim 3 wherein said ionomer is a Class II polymer comprising an organoonium moiety that is a pendant quatenary animonium group on the backbone of said Class II polymer.

11. The composition of claim 3 wherein said heat-sensitive ionomer is a Class II polymer represented by either of Structures III, IV or V:

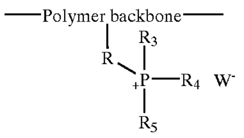

III

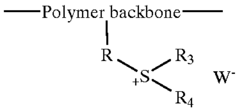

IV

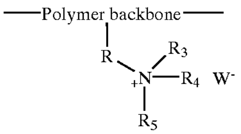

V wherein R is an alkylene, arylene, or cycloalkylene group or a combination of two or more such groups, $R_3$, $R_4$ and $R_5$ are independently substituted or unsubstituted alkyl, aryl or cycloalkyl groups, or any two of $R_3$, $R_4$ and $R_5$ can be combined to form a heterocyclic ring with the charged phosphorus, nitrogen or sulfur atom, and $W^-$ is an anion.

12. The composition of claim 11 wherein R is an ethyleneoxycarbonyl or phenylenemethylene group, and $R_3$, $R_4$ and $R_5$ are independently a methyl or ethyl group, and $W^-$ is a halide or carboxylate.

13. The composition of claim 11 wherein said heat-sensitive ionomer is represented by the structure VI:

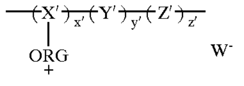

VI wherein ORG represents organoonium groups, X' represents recurring units to which the ORG groups are attached, Y' represents recurring units derived from ethylenically unsaturated polymerizable monomers that may provide active sites for crosslinking, Z' represents recurring units derived from any additional ethylenically unsaturated polymerizable monomers, $W^-$ is an anion, x' is from about 15 to about 99 mol %, y' is from about 1 to about 20 mol %, and z' is from 0 to about 84 mol %.

14. The composition of claim 13 wherein x' is from about 20 to about 98 mol %, y' is from about 2 to about 10 mol % and z' is from 0 to about 73 mol %.

15. The composition of claim 3 wherein said heat-sensitive ionomer is a Class III polymer having the Structure VII:

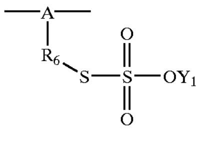

VII wherein A represents a polymeric backbone, $R_6$ is a divalent linking group, and $Y_1$ is a hydrogen or a cation.

16. The composition of claim 15 wherein $R_6$ is an alkylene group, an arylene group, an arylenealkylene group, or $-(COO)_{n'}(Z_1)_m$ wherein n' is 0 or 1, m is 0 or 1, and $Z_1$ is an alkylene group, an arylene group, or an arylenealkylene group, and $Y_1$ is hydrogen, ammonium ion or a metal ion.

17. The composition of claim 16 wherein $R_6$ is an alkylene group of 1 to 3 carbon atoms, an arylene of 6 carbon atoms in the aromatic ring, an arylenealkylene of 7 or 8 carbon atoms in the chain, or $-COOZ_1$ wherein $Z_1$ is methylene, ethylene or phenylene, and $Y_1$ is hydrogen, ammonium, sodium, or potassium.

18. The composition of claim 3 wherein said heat-sensitive ionomer is a Class IV polymer comprises at least 1 mole of carboxy or carboxylate groups per 1300 g of polymer.

19. The composition of claim 18 wherein said heat-sensitive ionomer is represented by Structure VIII below wherein "$A_1$" represents recurring units derived from ethylenically unsaturated polymerizable monomers, $X_1$ is a divalent linking group, $Z^+$ a monovalent cation, and $B_1$ represents non-carboxylated recurring units, p is 0 or 1, $m_1$ is 0 to about 75 mol %, and $n_1$ is from about 25 to 100 mol %

VIII

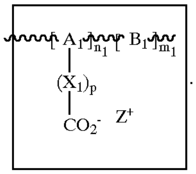

20. The composition of claim 19 wherein $Z^+$ is sodium, potassium, or a quaternary ammonium cation.

21. The composition of claim 20 wherein $Z^+$ is represented by $-N^+(R_7)(R_8)(R_9)(R_{10})$ wherein $R_7$, $R_8$, $R_9$, and $R_{10}$ are independently alkyl or aryl groups, or any two, three or four of $R_7$, $R_8$, $R_9$, and $R_{10}$ can be combined to form one or two heterocyclic rings with the charged nitrogen atom.

22. The composition of claim 21 wherein any two, three or four of $R_7$, $R_8$, $R_9$, and $R_{10}$ are combined to form one or two heterocyclic rings with the charged nitrogen atom.

23. The composition of claim 22 wherein the heterocyclic rings are indoline or isoindoline rings.

24. The composition of claim 21 wherein $R_7$, $R_8$ and $R_9$ are independently alkyl or aryl groups, or any two or all three of $R_7$, $R_8$ and $R_9$ can be combined to form one or two heterocyclic rings with the quatenary nitrogen atom, and $R_{10}$ is a substituted alkylenephenyl group in which the alkylene portion has 1 to 3 carbon atoms.

25. The composition of claim 24 wherein $R_{10}$ comprising a substituted or unsubstituted alkylene group portion having 1 to 2 carbon atoms and a phenyl group portion that can have up to five substituents.

26. The composition of claim 25 wherein $R_{10}$ comprises one or more halo, alkyl group, alkoxy group, cyano, nitro, aryl group, alkyleneoxycarbonyl group, alkylcarbonyloxy group, amido, amino carbonyl, formyl, mercapto, heterocyclic, trihalomethyl, or perfluoroalkyl substituents.

27. The composition of claim 26 wherein $R_{10}$ comprises 1 to 5 halo, methyl, ethyl, methoxy or 2-ethoxy substituents on the phenyl moiety.

28. The composition of claim 21 wherein at least one of $R_7$, $R_8$, $R_9$, or $R_{10}$ is a substituted or unsubstituted benzyl or phenyl group.

29. The composition of claim 19 wherein $m_1$ is from 0 to about 50 mol %, and said $B_1$ recurring units are derived from at least some additional ethylenically unsaturated polymerizable monomers having no carboxy groups, acid anhydride units, a conjugate base thereof, or carboxylate groups.

30. The composition of claim 19 wherein at least some of said $B_1$ recurring units are derived from acrylic acid, methacrylic acid, maleic anhydride or a conjugate base or a hydrolysis product thereof.

31. The composition of claim 19 wherein $X_1$ comprises one or more electron withdrawing groups.

32. The composition of claim 18 wherein said heat-sensitive ionomer is crosslinked with an epoxy-containing resin.

33. The composition of claim 1 wherein said heat-sensitive ionomer comprises ionic groups within at least 15 mol % of the polymer recurring units.

34. The composition of claim 1 wherein said heat-sensitive polymer is present at from about 1 to about 10% solids, and said latex polymer-carbon black composite particles are present at from about 0.1 to about 5 weight %.

35. An imaging member comprising a support having disposed thereon a hydrophilic imaging layer prepared from the composition according to claim 1.

36. The imaging member of claim 35 wherein said heat-sensitive ionomer is present in said imaging layer in an amount of at least 0.1 g/m$^2$, and said latex polymer-carbon black composite particles are present in said imaging layer in an amount sufficient to provide a transmission optical density of at least 0.1 at 830 nm.

37. The imaging member of claim 35 wherein said support is an on-press printing cylinder.

38. A method of imaging comprising the steps of:

A) providing the imaging member according to claim 35, and

B) imagewise exposing said imaging member to provide exposed and unexposed areas in the imaging layer of said imaging member, whereby said exposed areas are rendered more hydrophobic than said unexposed areas by heat provided by said imagewise exposure.

39. The method of claim 38 wherein said imagewise exposing is carried out using an IR radiation emitting laser, and said imaging member is a lithographic printing plate or imaging cylinder.

40. The method of claim 39 wherein said imagewise exposing is accomplished using a thermoresistive head.

41. A method of printing comprising the steps of:

A) providing the imaging member according to claim 35,

B) imagewise exposing said imaging member to provide exposed and unexposed areas in the imaging layer of said imaging member, whereby said exposed areas are rendered more hydrophobic than said unexposed areas by heat provided by said imagewise exposure, and C) contacting said imagewise exposed imaging member with a lithographic printing ink, and imagewise transferring said printing ink to a receiving material.

42. A method of imaging comprising the steps of:

A) spray coating the heat-sensitive composition according to claim 1 onto a support to provide an imaging member, and B) imagewise exposing said imaging member to provide exposed and unexposed areas in the imaging layer of said imaging member, whereby said exposed areas are rendered more hydrophobic than said unexposed areas by heat provided by said imagewise exposure.

43. The method of claim 42 wherein said support is an on-press printing cylinder or sleeve.

44. The heat-sensitive composition of claim 1 wherein said latex polymer-carbon black composite particles comprise a latex polymer phase formed in the presence of carbon black particles in situ using an emulsion polymerization process.

45. The heat-sensitive composition of claim 1 wherein said latex polymer-carbon black composite particles are greater than 5 nm and less than 1 $\mu$m in size.

* * * * *